(12) United States Patent
Parker et al.

(10) Patent No.: US 7,456,402 B2
(45) Date of Patent: Nov. 25, 2008

(54) DETECTOR OPTICS FOR MULTIPLE ELECTRON BEAM TEST SYSTEM

(75) Inventors: N. William Parker, Pleasanton, CA (US); S. Daniel Miller, Gilroy, CA (US)

(73) Assignee: Multibeam Systems, Inc., Santa Clara, CA (US)

( * ) Notice: Subject to any disclaimer, the term of this patent is extended or adjusted under 35 U.S.C. 154(b) by 424 days.

(21) Appl. No.: 11/355,256

(22) Filed: Feb. 14, 2006

(65) Prior Publication Data

US 2006/0169899 A1    Aug. 3, 2006

Related U.S. Application Data

(63) Continuation-in-part of application No. 11/225,376, filed on Sep. 12, 2005, and a continuation-in-part of application No. 11/093,000, filed on Mar. 28, 2005, now Pat. No. 7,227,142.

(60) Provisional application No. 60/608,609, filed on Sep. 10, 2004.

(51) Int. Cl.
*G01N 23/00* (2006.01)
(52) U.S. Cl. .................. 250/310; 250/311; 250/306
(58) Field of Classification Search ....... 250/306–443.1
See application file for complete search history.

(56) References Cited

U.S. PATENT DOCUMENTS

| | | | |
|---|---|---|---|
| 4,342,949 A | 8/1982 | Harte et al. | |
| 4,742,234 A | 5/1988 | Feldman et al. | |
| 4,902,898 A | 2/1990 | Jones et al. | |
| 5,276,330 A | 1/1994 | Gesley | |
| 5,430,292 A | 7/1995 | Honjo et al. | |
| 5,466,940 A | 11/1995 | Litman et al. | |
| 5,608,218 A | 3/1997 | Sato et al. | |
| 5,644,132 A | 7/1997 | Litman et al. | |
| 5,982,190 A | 11/1999 | Toro-Lira | |
| 6,075,245 A | 6/2000 | Toro-Lira | |

(Continued)

OTHER PUBLICATIONS

Search Report issued Aug. 20, 2007 in corresponding PCT application No. PCT/US2006/11381.

(Continued)

*Primary Examiner*—Jack I. Berman
*Assistant Examiner*—Andrew Smyth
(74) *Attorney, Agent, or Firm*—David H. Jaffer; Pillsbury Winthrop Shaw Pittman LLP

(57) ABSTRACT

A detector optics system for collecting secondary electrons (SEs) and/or backscattered electrons (BSEs) in a multiple charged particle beam test system is disclosed. Aspects of the detector optics system include: the ability to image and/or electrically test a number of locations simultaneously across the full width of a large substrate with high throughput and uniform collection efficiency while avoiding crosstalk between signals generated by neighboring beams. In one embodiment, a linear array of N electron beams causes SEs to be emitted from the substrate, which are then collected by one or more linear arrays of $\geq 2N$ detectors. Each linear array is connected to a signal combiner circuit which dynamically determines which detectors are collecting SEs generated by each electron beam as it scans across the substrate surface and then combines the signals from these detectors to form N simultaneous output signals (one per charged particle beam) for each detector array.

25 Claims, 23 Drawing Sheets

U.S. PATENT DOCUMENTS

| | | |
|---|---|---|
| 6,627,886 B1 | 9/2003 | Shachal et al. |
| 6,734,428 B2 | 5/2004 | Parker et al. |
| 6,777,675 B2 | 8/2004 | Parker et al. |
| 6,797,953 B2 | 9/2004 | Gerlach et al. |
| 6,878,936 B2 | 4/2005 | Kienzle et al. |
| 6,943,351 B2 | 9/2005 | Parker |
| 2005/0001165 A1 | 1/2005 | Parker et al. |
| 2005/0285541 A1* | 12/2005 | LeChevalier ............. 315/169.3 |

OTHER PUBLICATIONS

Search Report issued Aug. 8, 2007 in corresponding PCT application No. PCT/US2006/19113.

* cited by examiner

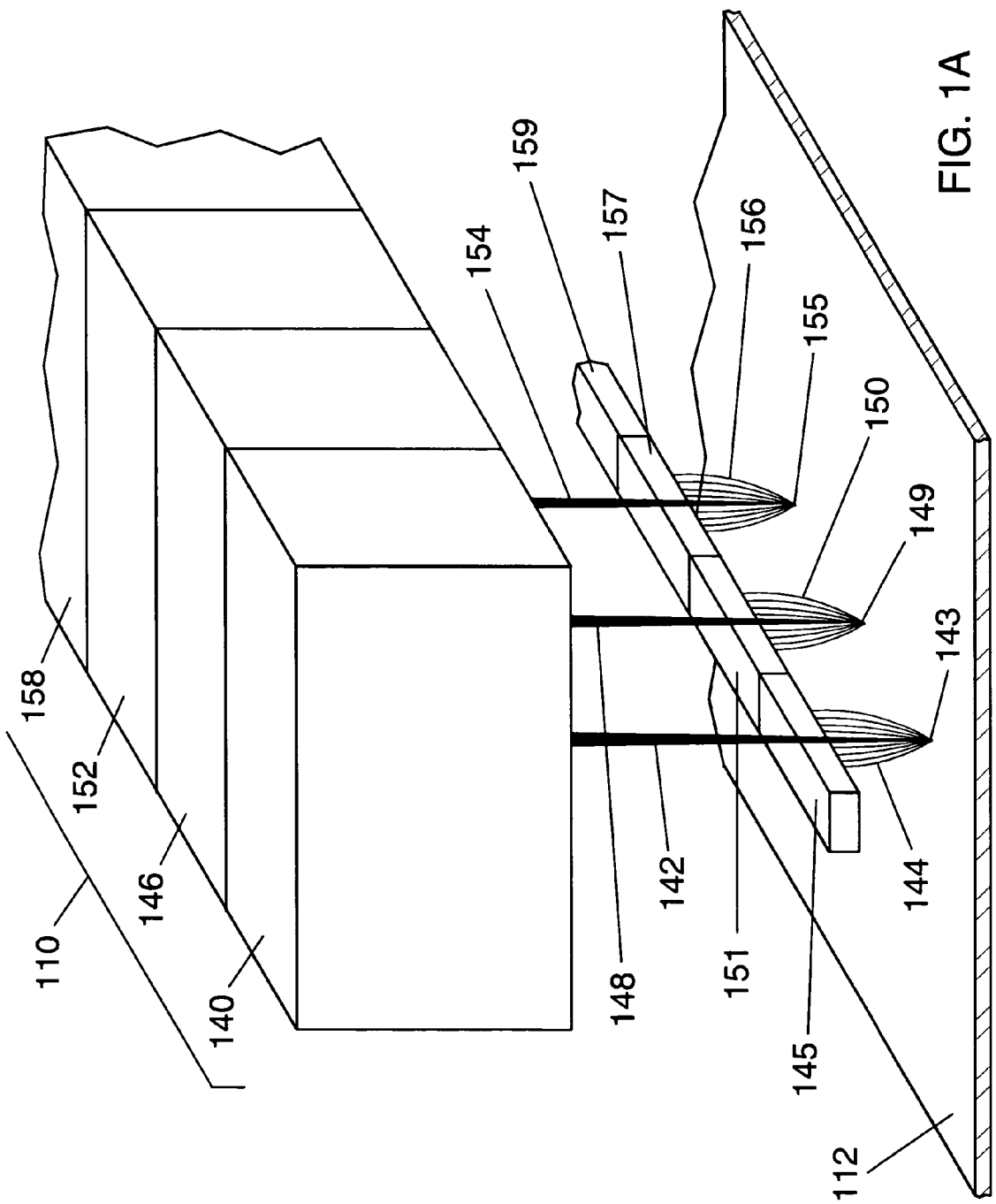

DETECTOR OPTICS FOR MULTIPLE ELECTRON BEAM TEST SYSTEM

CROSS-REFERENCE TO RELATED APPLICATIONS

This application is a continuation-in-part of U.S. application Ser. No. 11/225,376 filed Sep. 12, 2005, which claims the benefit of U.S. Provisional Application Ser. No. 60/608,609 filed Sep. 10, 2004, and is a continuation-in-part of U.S. application Ser. No. 11/093,000 filed Mar. 28, 2005 now U.S. Pat. No. 7,227,142. The foregoing applications are incorporated by reference herein.

BACKGROUND OF THE INVENTION

1. Field of the Invention

This invention relates generally to the field of charged particle optics, and more particularly to electron detector optics for high throughput large substrate electron-beam testing systems.

2. Description of the Related Art

The use of electron beams to inspect and electrically test flat panel display substrates is an established technique. The different testing strategies may be characterized by the method of obtaining the test signal from each pixel in the display: mechanical probe testing; electron-beam probe testing; and voltage imaging.

Mechanical probe testing of a flat panel display substrate is illustrated in FIG. 13. During manufacture, all the signal lines 1310 on the display substrate are connected together to one or more signal line shorting bars 1306. Similarly, all the gate lines 1312 are connected together to one or more gate line shorting bars 1308. To connect the mechanical probe testing system to shorting bar 1306, a mechanical probe 1305 physically contacts the signal line shorting bar 1306 and also is connected to the system ground, as shown. A second mechanical probe 1307 connects to the gate line shorting bar 1308 and is also connected to voltage supply 1314. Pixel electrode 1303 is connected to the control transistor 1311 by line 1309 and to an electrometer 1304 by means of support arm 1301 and a mechanical probe 1302. The voltage on the pixel electrode 1303 is measured by the electrometer 1304. The physical probe 1302 supplies a testing current to the pixel electrode 1303 and hence to the control transistor 1311. Testing of the pixel electrode 1303 and control transistor 1311 is then performed by monitoring the electrical response to the charging current using the electrometer 1304. Capacitor 1313 is formed by the overlap between the gate electrode of the control transistor 1311 and the pixel electrode 1303. Typical measurements made include the following: absence/presence of shorting between neighboring pixel electrodes, breaks or shorts in the connections to the control transistor 1311, excessive leakage currents due to too-low isolation resistance in the pixel electrode 1303. The signature of a properly-functioning pixel drive circuit is characterized, as well as the signatures resulting from various pixel malfunctions, such as shorted or open lines, degraded insulating regions within the pixel element, neighboring pixel elements shorted together, etc. Thus mechanical probe testing allows identification of various pixel defects.

Electron-beam probe testing is illustrated in FIG. 14 and is similar to mechanical probe testing, described above, except the third mechanical probe 1302 (shown in FIG. 13) has been replaced by an electron beam 1420 which supplies the charging current to the pixel element 1403. 1405-1414 are equivalent to 1305-1314, described above with reference to FIG. 13. The impact of electron beam 1420 with pixel element 1403 causes the emission of secondary electrons 1421 from pixel element 1403. Secondary electrons 1421 are collected by detector 1422 to form a voltage contrast signal (similar to the signal generated by electrometer 1304 in FIG. 13). The many advantages of electron-beam probe testing over mechanical probe testing are: no-contact and thus no risk of contact damage; faster selection between pixel elements to test; and the opportunity for fast rechecking of all pixels failing a first-pass testing procedure. The electron beam 1420 is generated by an electron optical column; there are some examples in the prior art of testing systems with multiple columns (typically 2-4), each column producing a single electron beam.

Voltage imaging is illustrated in FIG. 15, where all the pixels in display substrate 1550 are being inspected in parallel. Light 1556 from light source 1555 illuminates a splitter mirror 1553. Reflected light 1557 off the upper surface of the splitter mirror 1553 illuminates the under surface of an electro-optic modulator 1552. An optional interface card 1551 may be interposed between the display substrate 1550 and the upper surface of the electro-optic modulator 1552 to improve the coupling of the voltages on the display substrate 1550 to the electro-optic modulator 1552. Due to the electro-optic interaction of the voltages on the display substrate 1550 with the modulator 1552, the reflectivity of light 1557 off the lower surface of the modulator 1552 is affected. Light 1558 represents that fraction of light 1557 which is not reflected off the splitter 1553, instead passing downwards through the beam splitter 1553 to be collected by a CCD camera 1554, which is coupled to display electronics (not shown) to generate a voltage image of the display substrate 1550. A significant disadvantage of this method is the need to fabricate a new modulator 1552 for each new display design.

All three of the flat panel display substrate testing systems and methods described above suffer from throughput limitations which will only get worse as the size of display substrates continues to increase. There is a need for flat panel display substrate testing systems and methods that have higher throughput and that are more readily scalable to larger substrates.

For flat panel display testing, it is also desired to test 100% of the pixels on the substrate surface since typically a display with more than a few defective pixels is unusable. In some cases, if defective pixels are detected early enough in the manufacturing process, these pixels can be repaired. In other cases, if a substrate is found to have numerous defective pixels, it is more economical to scrap that substrate prior to further processing. Substrate testing also provides process feedback: if successive substrates show increasing numbers of defective pixels, a deviation from proper process parameters (etch, deposition, lithography, etc.) may have occurred, which must be corrected quickly to restore normal production yields. There is a need for inspection systems that are able to test 100% of the pixels on a FPD substrate with a high throughput.

Electron beam systems employed for testing or inspection purposes typically generate one or more primary electron beams (or "probes") which are focused onto the surface of a substrate by probe-forming optics. When the primary electron beam strikes the substrate surface, it generates both secondary electrons and backscattered electrons (SE/BSEs) as is familiar to those skilled in the art. The SE/BSEs are emitted over a wide angular range, spreading out over a distance which may exceed several mm in extent at the detector collection surface. The signal detection process generally involves the collection of secondary electrons (SEs) and/or backscattered electrons (BSEs). Typically, there will be at most one SE detector and/or one BSE detector per primary electron beam. When the test system comprises multiple electron beam columns, with multiple SE and BSE detectors, efficient collection of SEs and BSEs may be compromised by cross-talk between neighboring columns. Cross-talk occurs when the SEs and/or BSEs from one column are collected by the detectors associated with a neighboring column. There is a need for multiple column electron beam test systems for FPDs that are designed to minimize cross-talk between neighboring columns' detectors.

There is a need for multiple electron beam test systems which meet the three requirements of: high throughput; with 100% pixel testing; while avoiding intercolumn crosstalk between testing signals.

SUMMARY OF THE INVENTION

Disclosed herein is a charged particle optical system comprising: N charged particle beam columns in a linear array, aligned along a main scan axis; and a linear array of at least 2N electron detectors aligned parallel to and offset from the main scan axis. Each column generates a single charged particle beam which is focused onto the surface of a substrate for imaging and/or testing purposes. The charged particle beam columns are equally spaced and each beam is deflectable through a large angle along the main scan axis. There are at least two charged particle detectors per column. The charged particle detectors can be SE and/or BSE detectors. There may be more than one linear array of detectors, where the multiple linear arrays may include SE and/or BSE detectors. The multiple linear arrays of detectors may be offset on opposite sides, or on the same side, of the linear array of columns. The signals collected by the linear arrays of SE and/or BSE detectors may be combined in signal combiner circuits (one per detector array), each signal combiner circuit generating a number of output signals equal to the number of charged particle beam columns. The signal combiner circuits are configured to receive input data from the controller for the linear array of columns, providing information on the positions of each charged particle beam on the substrate surface. Using this positional information, the signal combiner determines which detectors within each linear detector array to use in forming each output signal.

In preferred embodiments, the scan fields of the charged particle beams from each column abut or overlap with the scan fields of the neighboring columns in the linear array. In other words, the charged particle beams are deflectable in the plane of a substrate a distance greater than or equal to half the spacing of the columns.

The detector optics is configured to keep the SE/BSE signals substantially separate—uncontaminated by the SE/BSE signals from neighboring columns. This is achieved by tailoring the size, spacing and number per column of detectors in each linear array. Further, the position of the detectors relative to the main axis of each column can be adjusted. The spread of the SE/BSE distribution from each charged particle beam at the linear detector array is key to optimizing the detector optics design. In preferred embodiments, there are at least two detectors per column in a linear array and the center-to-center spacing of the detectors is less than the width of the SE/BSE distribution.

In flat panel display (FPD) testing, there are three important tool design requirements:

1) Throughput—because FPD substrates contain such a large number of pixels to be tested, spread over an rectangular area with two large dimensions (both dimensions being typically >2 m), in order to achieve acceptable testing throughput the charged particle optical testing system is preferably capable of focusing a large number (typically 20 or more) of beams onto the substrate surface across the full width of the substrate to enable simultaneous testing of multiple pixels;

2) Testing of All Pixels—it is desirable to test 100% of the pixels on the substrate surface to ensure that no defective pixels go undetected; and 3) Signal Separation Between Neighboring Columns—for unambiguous testing signals to be generated by each column, mixing of SE/BSE signals from neighboring columns is preferably minimized.

In preferred embodiments of the present invention the above three design requirements for a multiple charged particle beam test system are all met, namely: high throughput, 100% testing of pixels, and substantially complete separation between SE/BSE signals from neighboring columns.

BRIEF DESCRIPTION OF THE FIGURES

FIG. 1A is an isometric view of an electron beam test system used to generate secondary electrons and backscattered electrons (SE/BSEs) from multiple locations on a substrate surface; these SE/BSEs are collected by multiple detectors separated by narrow gaps to generate multiple simultaneous signals from a substrate.

DETAILED DESCRIPTION

The purpose of the present invention is to meet the following three important tool design requirements for FPD testing:
1. Throughput—the electron optical testing system is preferably capable of focusing a large number (typically 20 or more) of beams onto the substrate surface across the full width of the substrate;
2. Testing of All Pixels—it is desired to test 100% of the pixels on the substrate surface; and
3. Signal Separation Between Neighboring Columns—mixing of SE/BSE signals from neighboring columns is preferably minimized.

The first requirement can be met using a multiple electron beam column assembly such as that shown in U.S. patent application Ser. No. 11/225,376, filed Sep. 12, 2005, incorporated by reference herein. U.S. patent application Ser. No. 11/225,376 discloses a multiple electron beam column assembly generating a linear array of electron beams where the major scan axis is aligned parallel to the linear array of beams. The use of multiple electron beams simultaneously testing multiple pixels increases the system throughput roughly proportionately to the number of beams.

Figure 19A:
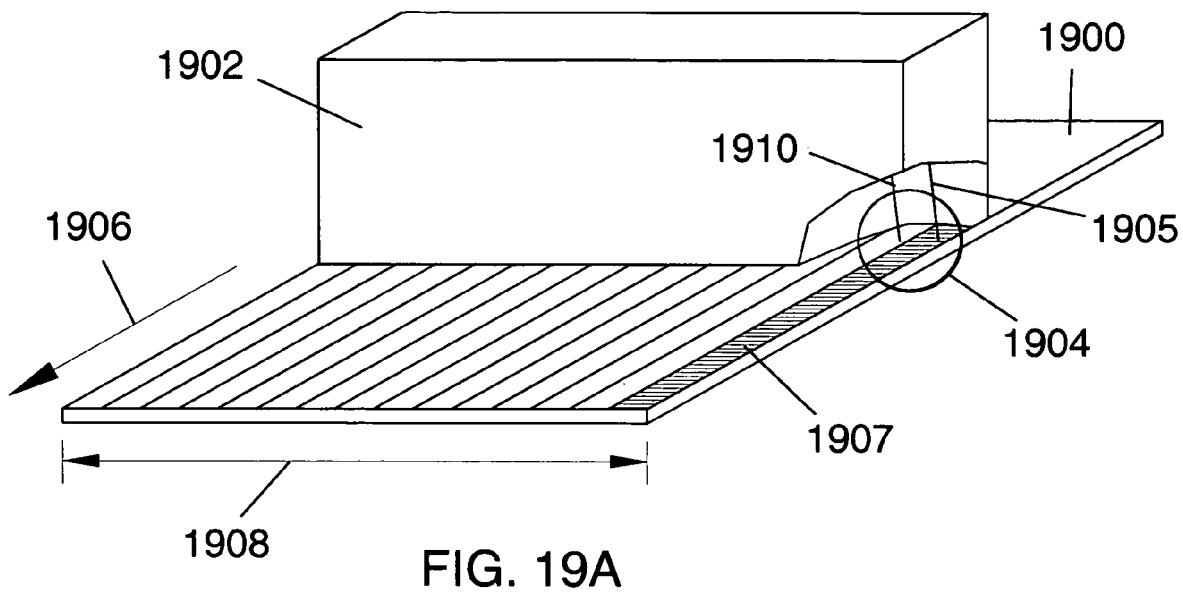
FIG. 19A shows a multi-beam multi-column testing system, indicating the methodology for flat panel display substrate inspection embodied in the present invention.
Figure 19B:
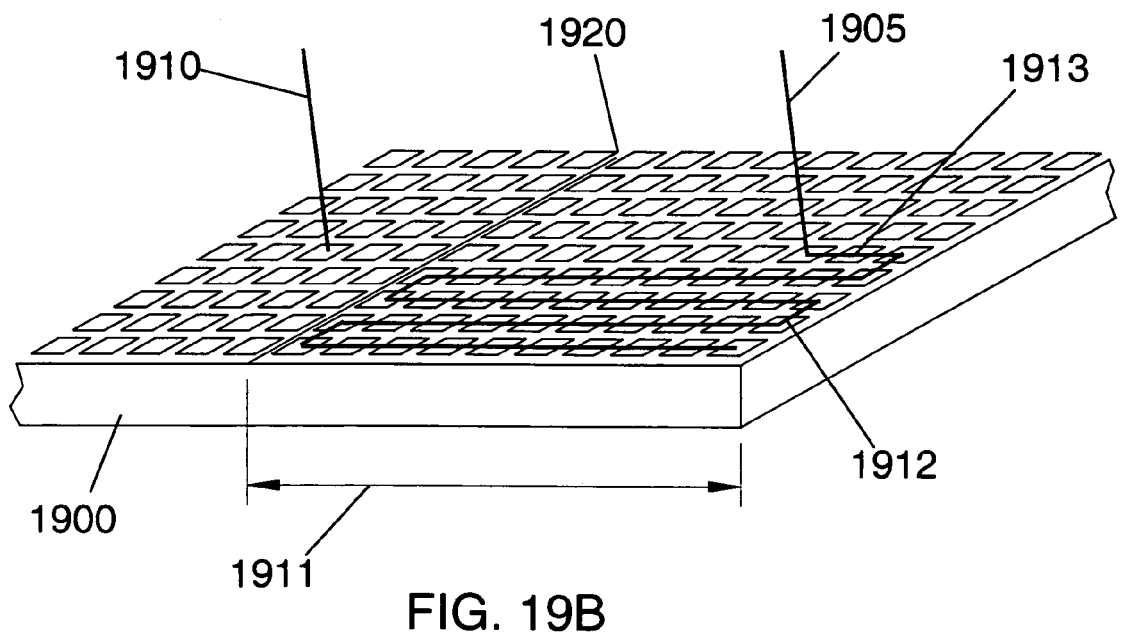
FIG. 19B is a close-up of the substrate in FIG. 19A showing individual pixels and indicating a serpentine scan of the electron beam.

In order to achieve the second requirement, 100% testing, it is desirable to be able to position at least one of the electron beams generated by the linear array of columns on every location on the substrate. FIG. 19A illustrates an electron beam column assembly 1902 testing substrate 1900 with multiple electron beams 1905 and 1910 (other beams not shown), visible in cutaway 1904. The substrate moves along the X-axis (arrow 1906), while the electron beams scan parallel to the Y-axis as shown in FIG. 19B, corresponding to cutaway 1904 in FIG. 19A. The width 1908 of the substrate 1900 is N times the width 1911 of the stripe 1907, where N is the number of electron beams generated by assembly 1902. Electron beam 1905 is shown scanning a stripe 1907 of width 1911. Within stripe 1907, a number of pixels 1913 are being tested. The scan width 1911 of beam 1905 overlaps with the scan width of beam 1910 at the edge 1920 of stripe 1907. To avoid the need to retrace beam 1905 at the end of a scan, beam 1905 can be moved across the substrate in a serpentine pattern 1912 as shown. To facilitate 100% pixel testing, the linear array can be designed so that the electron beam of a particular column can be deflected off the optical axis a distance equal to or greater than half the intercolumn spacing. For example, with columns spaced 125 mm apart, the beam deflection must equal or exceed ±62.5 mm.

Figure 1B:
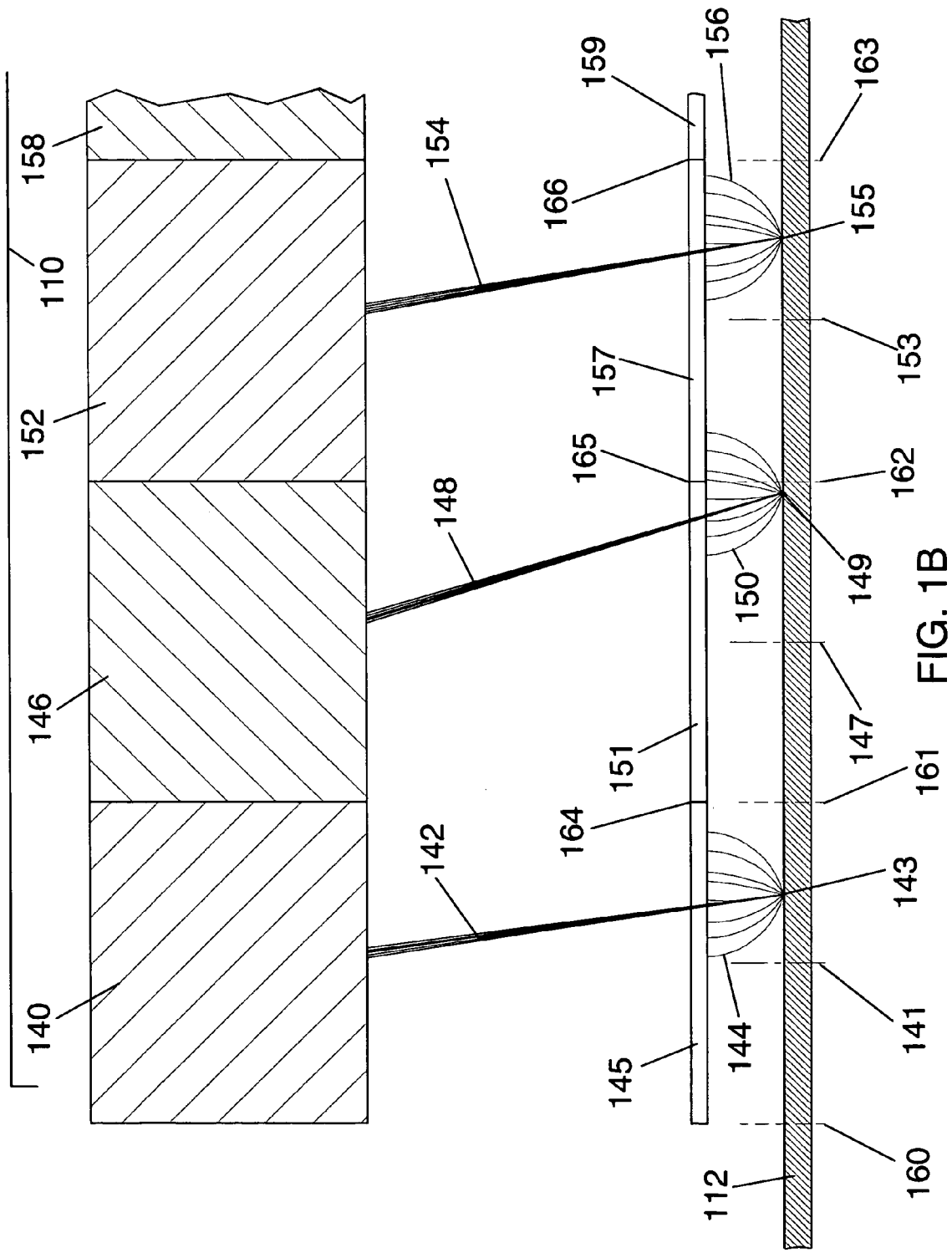
FIG. 1B is a schematic cross-sectional representation of the multiple electron beam test system in FIG. 1A in a plane containing the optical axes of the multiple electron beam columns, illustrating the use of multiple parallel electron beams to scan the full width of the substrate.
Figure 1C:
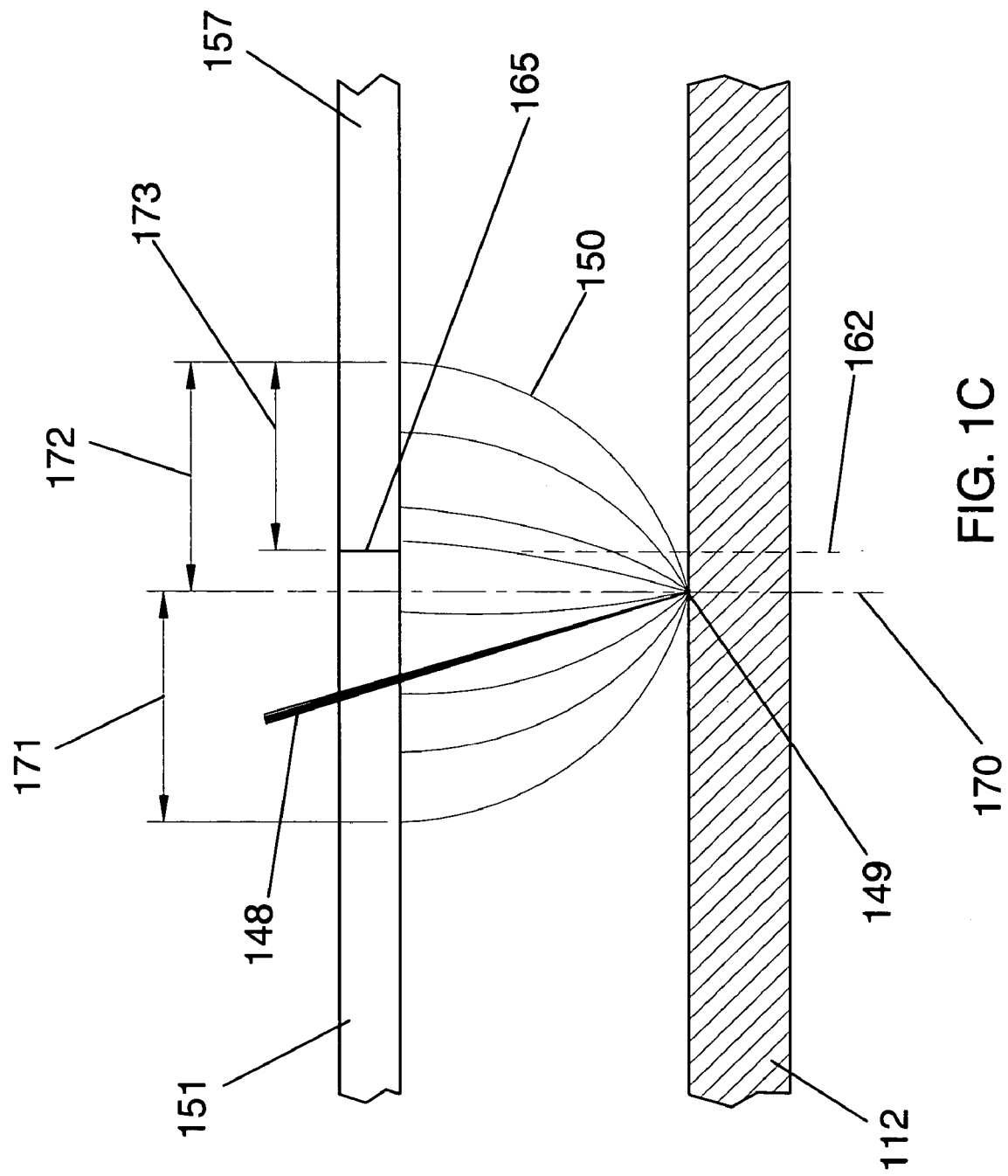
FIG. 1C is a close-up of the intersection of beam 148 with the substrate in FIG. 1B, showing the cause of intercolumn crosstalk.
Figure 12A:
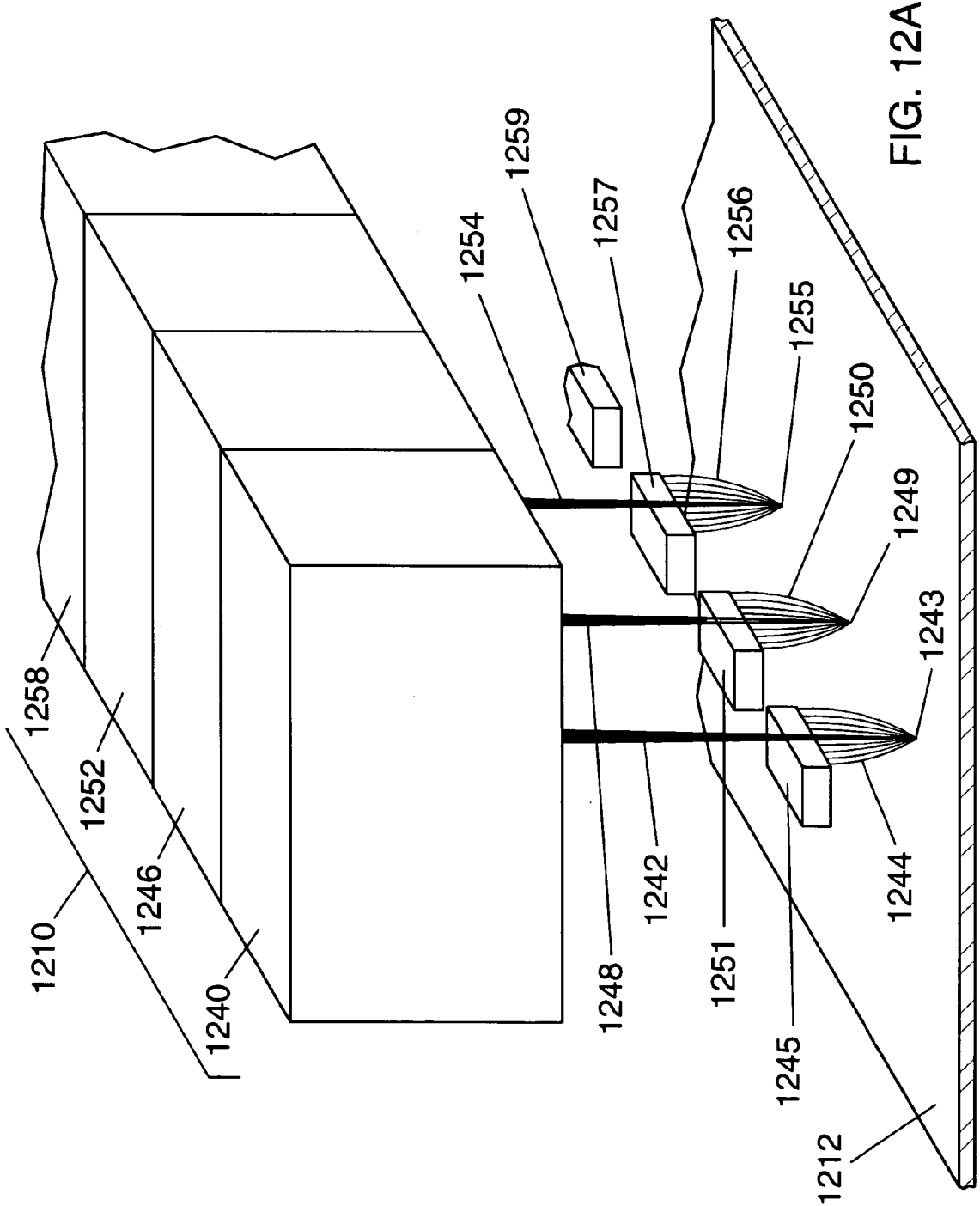
FIG. 12A is an isometric view of an electron beam test system used to generate secondary electrons and backscattered electrons (SE/BSEs) from multiple locations on a substrate surface; these SE/BSEs are collected by multiple detectors separated by wide gaps to generate multiple simultaneous signals from a substrate.
Figure 12B:
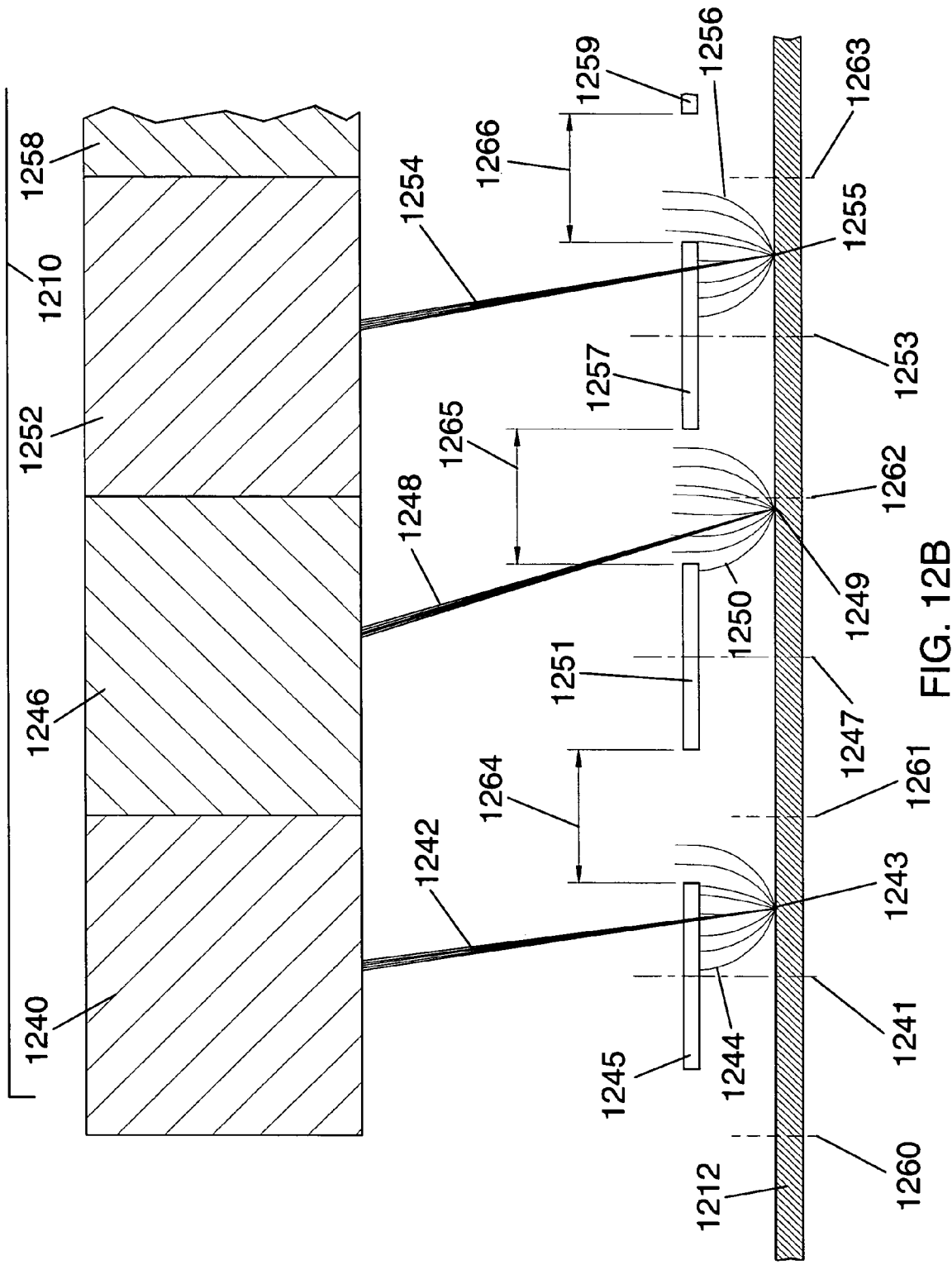
FIG. 12B is a schematic cross-sectional representation of the multiple electron beam test system in FIG. 12A in a plane containing the optical axes of the multiple electron beam columns, illustrating the use of multiple parallel electron beams to scan the full width of the substrate.
Figure 13:
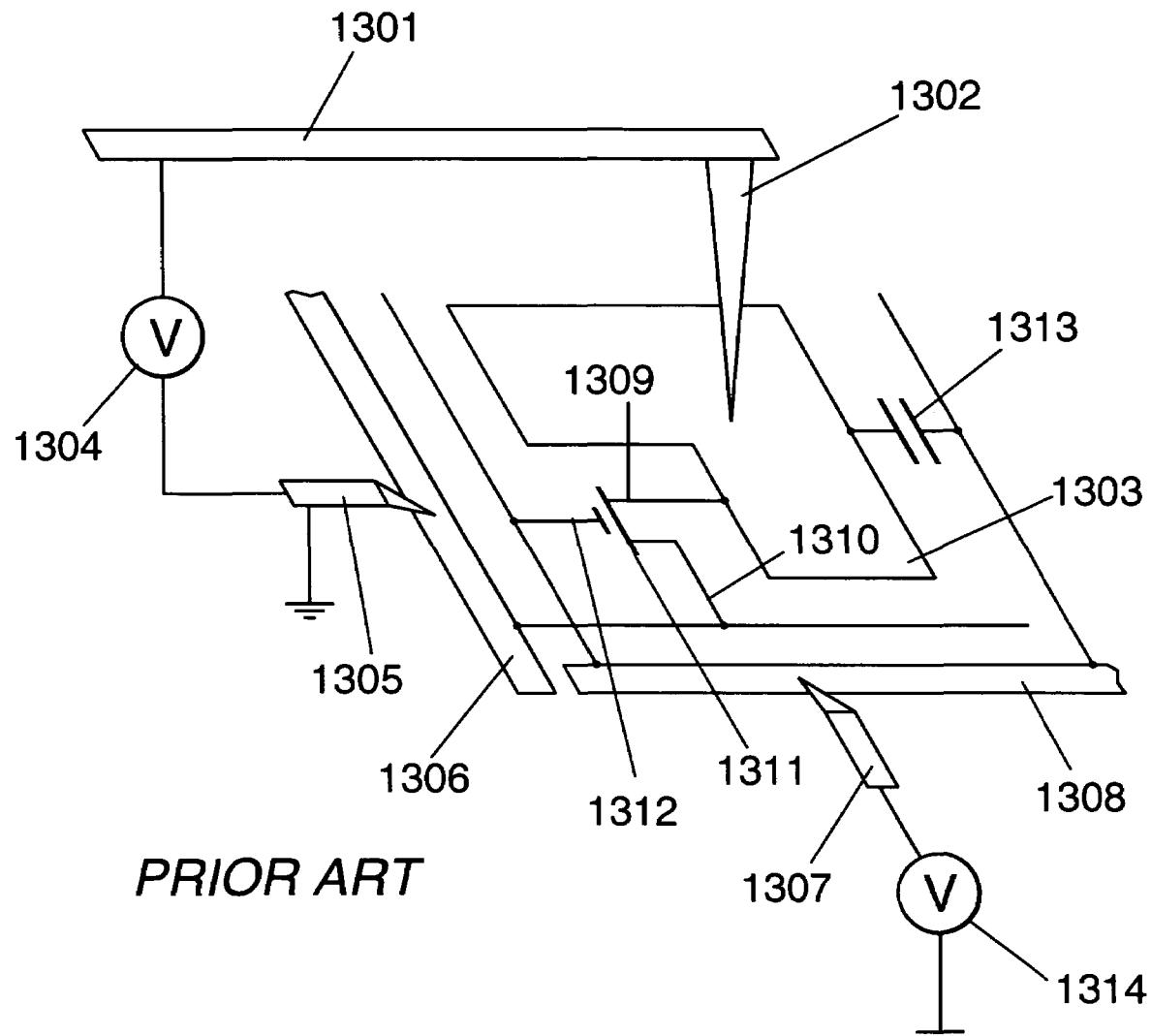
FIG. 13 shows an example of prior art for testing flat panel display substrates utilizing mechanical probing.
Figure 14:
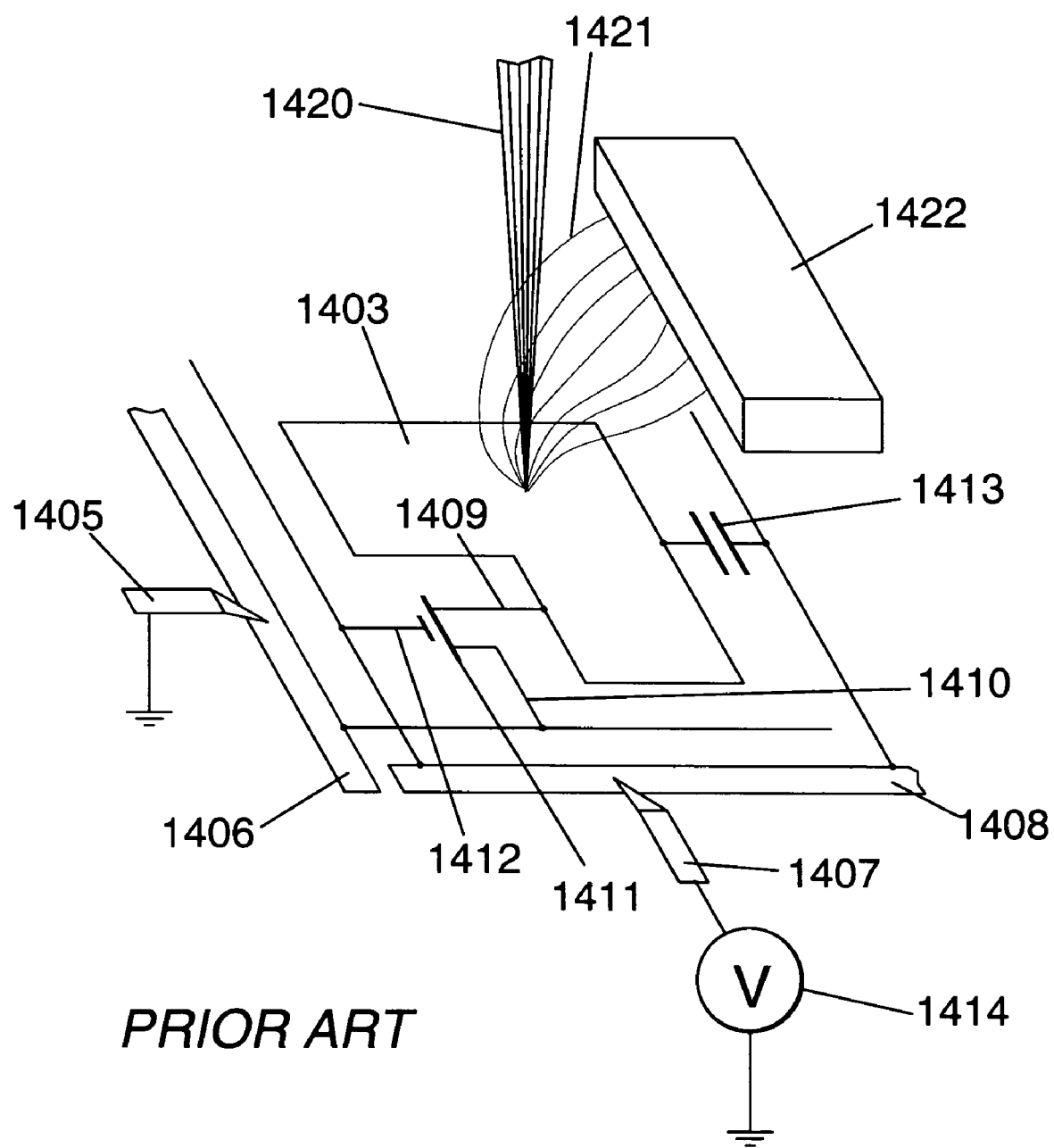
FIG. 14 shows an example of prior art for testing flat panel display substrates utilizing electron-beam probing.
Figure 15:
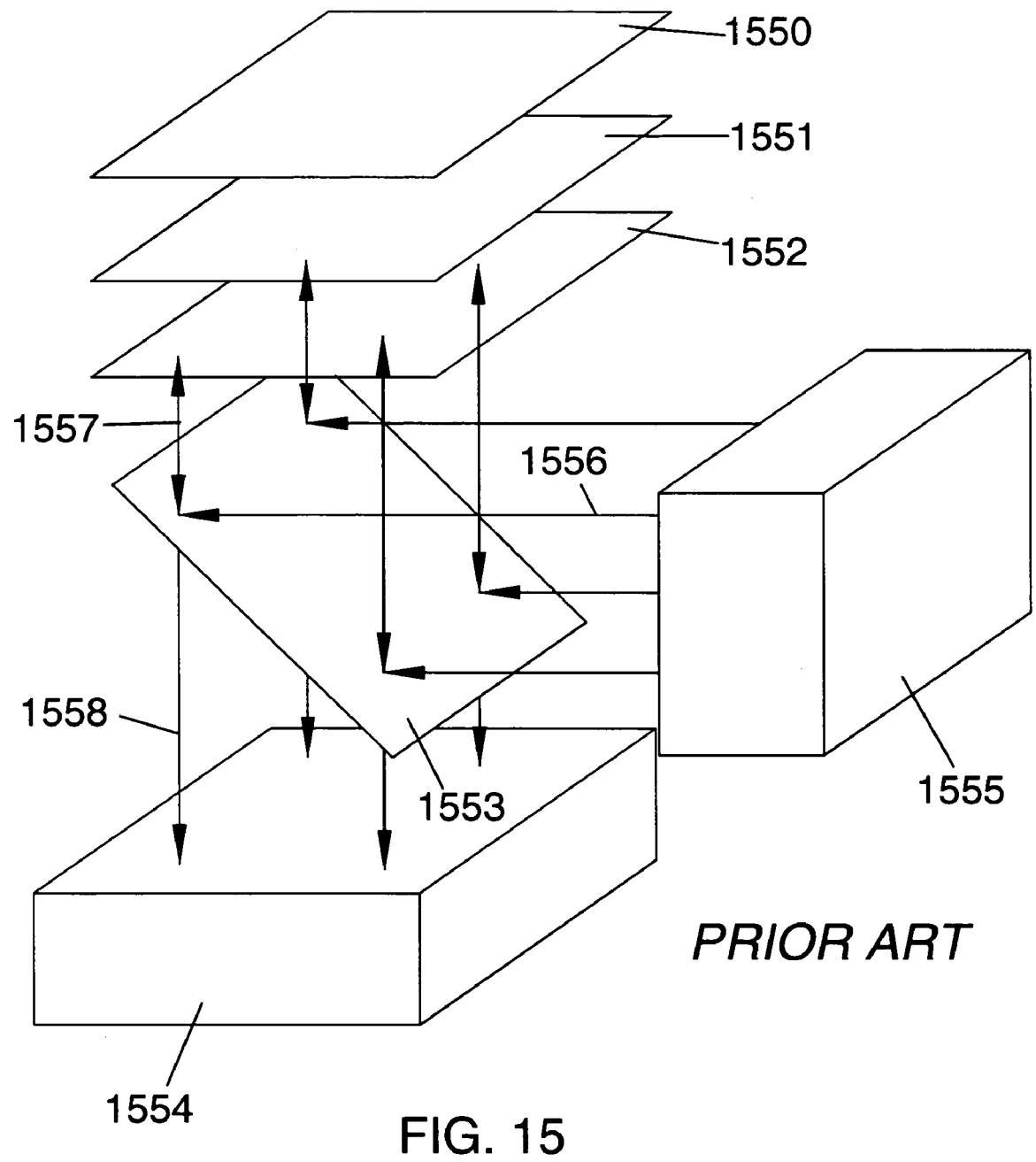
FIG. 15 shows an example of prior art for testing flat panel display substrates utilizing voltage imaging.

The simultaneous accomplishment of both the second and third requirements is difficult. To achieve 100% pixel testing as described above, it is necessary to be able to collect SE/BSEs generated by an electron beam even when the beam position on the substrate surface is deflected off the optical axis by approximately half the intercolumn spacing (to the "intercolumn midpoint"). In general, this will require that the SE/BSE detector physically extends to near the intercolumn midpoint, as shown in FIGS. 1A-1C. Although this enables the efficient collection of SE/BSEs generated from the surface out to the intercolumn midpoint, a problem arises in maintaining the separation of the SE/BSE signals for neighboring columns. "Crosstalk" between neighboring columns arises because some of the SE/BSEs will be collected by the detector for the neighboring column instead of by the detector for the column generating the SE/BSEs (see overlap 173 in FIG. 1C). This crosstalk violates the third design requirement. FIGS. 12A and 12B illustrate a method of reducing this crosstalk by shortening the detectors to move their ends away from the intercolumn midpoint. FIG. 12B shows that shortening the detectors results in reduced collection efficiency near the intercolumn midpoint (for example, see SE/BSEs 1250 in FIG. 12B, most of which are not collected by detector 1251), making it difficult or impossible to test pixels there.

FIGS. 12A and 12B are two views of an electron beam testing system which meets requirements one and three, but not requirement two—this system is similar to that disclosed in U.S. patent application Ser. No. 11/093,000 filed Mar. 28, 2005, incorporated by reference herein. FIG. 12A is an isometric view showing multiple electron beams inducing the emission of secondary electrons and backscattered electrons (SE/BSEs) from multiple locations on a substrate surface—these SE/BSEs are collected by multiple detectors to generate simultaneous signals (one per electron beam) from a substrate. FIG. 12B is a cross-sectional view of the multiple electron beam testing system shown in FIG. 12A through a plane containing the optical axes 1241, 1247 and 1253 of columns 1240, 1246 and 1252. The notation "SE/BSE" will be used herein to designate either a pure SE signal, a pure BSE signal, or a combined signal resulting from a mixture of SE and BSE signals. Electron-beam column array 1210 comprises columns 1240, 1246, 1252, and 1258. A linear detector array comprises detectors 1245, 1251, 1257, and 1259 separated by gaps 1264-1266 as shown. The function of gaps 1264-1266 is to provide electrical isolation between neighboring detectors. Gaps 1264-1266 can be either vacuum gaps or can be filled with an insulating material. In any case, however, it can be seen that the detectors fail to collect all of the SE/BSEs from the surface. In particular, SE/BSEs 1250 generated by beam 1248 almost entirely miss detector 1251. Larger fractions of SE/BSEs 1244 and 1256, are collected by detectors 1245 and 1257, respectively. Note that when the beam positions 1243, 1249, and 1255 are near the optical axes 1241, 1247, and 1253, respectively, then the collection efficiencies are maximized, falling off monotonically with increasing distance from the optical axes. Thus, there are two problems with the detector configuration shown in FIGS. 12A-12B:

1) The SE/BSE collection is decreased due to SE/BSEs missing the collection surface of the detectors, and
2) The SE/BSE collection varies as a function of the position of the beam on the substrate surface.

Each of the columns in array 1210 functions independently of the other columns. A typical electron beam column for this application is described in U.S. patent application Ser. No. 11/225,376. For example, column 1240 generates electron beam 1242 which is focused by column 1240 onto the surface of substrate 1212 at position 1243. Beam 1242 has been deflected away from the optical axis 1241 of column 1240 by a deflector in column 1240 (not shown). When beam 1242 strikes the surface of substrate 1212 at position 1243, it causes the emission of SE/BSEs 1244. Most of SE/BSEs 1244 are collected by detector 1245, however a sizeable fraction at the right are not detected.

Similarly, column 1246 generates electron beam 1248 which is focused by column 1246 onto the surface of substrate 1212 at position 1249. Beam 1248 has been deflected almost the maximum distance away from the optical axis 1247 of column 1246 by a deflector in column 1246 (not shown). When beam 1248 strikes the surface of substrate 1212 at position 1249, it causes the emission of SE/BSEs 1250. Because detector 1251 is narrower than the full scan width (the distance between scan limits 1261 and 1262), almost none of SE/BSEs 1250 are collected by detector 1251.

Like columns 1240 and 1246, column 1252 generates electron beam 1254 which is focused by column 1252 onto the surface of substrate 1212 at position 1255. Beam 1254 has been deflected away from the optical axis 1253 of column 1252 by a deflector in column 1252 (not shown). When beam 1254 strikes the surface of substrate 1212 at position 1255, it causes the emission of SE/BSEs 1256. Slightly more than half of SE/BSEs 1256 are collected by detector 1257.

In FIG. 12B, scan limits 1260 and 1261 show the maximum allowable range for position 1243—this is the maximum extent of the deflection of beam 1242 required to abut the scans generated by neighboring columns. For example, with an intercolumn spacing of 125 mm, limits 1260 and 1261 would be −62.5 mm and +62.5 mm from optical axis 1241, respectively, where the displacement is parallel to the plane containing the optical axes 1241, 1247, and 1253. Similarly, scan limits 1261 and 1262 define the maximum range for position 1249, and limits 1262 and 1263 define the maximum range for position 1255. Gap 1264 is between the ends of detectors 1245 and 1251 and is centered directly above scan limit 1261. Gap 1265 is between the ends of detectors 1251 and 1257 and is centered directly above scan limit 1262. Gap 1266 is between the ends of detectors 1257 and 1259, and is centered directly above scan limit 1263.

The present invention is a detector optics system for an electron probe system having the ability to image and/or electrically test a number of locations simultaneously across the full width of a large substrate, while avoiding crosstalk between neighboring beams. A linear array of N electron beams causes secondary electrons (SEs) and backscattered electrons (BSEs) to be emitted from the substrate, which are then collected by a linear array of $\geq 2N$ detectors. A signal combiner circuit: (1) dynamically determines which detectors are collecting SEs and/or BSEs associated with each electron beam as the beam scans across the substrate surface; and then (2) combines the signals from the detectors to form N simultaneous output signals.

FIGS. 1A and 1B are two views of an electron beam testing system which meets the design requirements for high throughput and 100% pixel testing, but not the requirement to avoid intercolumn crosstalk. FIG. 1A is an isometric view of an electron beam testing system showing multiple electron beams inducing the emission of secondary electrons and backscattered electrons (SE/BSEs) simultaneously from several locations on a substrate surface—these SE/BSEs are collected by multiple detectors to generate multiple simultaneous signals (one per electron beam) from a substrate. FIG. 1B is a cross-sectional view of the electron beam testing system shown in FIG. 1A through a plane containing optical axes 141, 147 and 153. The notation "SE/BSE" is the same as that used in FIGS. 12A-12B. Electron-beam column array 110 comprises columns 140, 146, 152, and 158. A linear detector array comprises detectors 145,151,157, and 159 with separators 164-166 as shown. The key improvement in the detector optics design relative to FIGS. 12A-12B is the substitution of separators 164-166 for the wide interdetector gaps 1264-1266 in FIGS. 12A-12B. Separators 164-166 are made as narrow as possible by increasing the lengths of the detectors 145,151,157, and 159, thereby increasing the SE/BSE collection efficiencies. The function of separators 164-166 is to preserve the signal separation between neighboring detectors. Separators 164-166 are either vacuum gaps or are fabricated from an insulating material—in either case, the width of the separators is minimized to reduce signal loss since SE/BSEs which land on a separator are not detected. Each of the columns in array 110 functions independently of the other columns. A typical electron beam column for this application is described in U.S. patent application Ser. No. 11/225,376 filed Sep. 12, 2005 which is incorporated herein by reference. For example, column 140 generates electron beam 142 which is focused by column 140 onto the surface of substrate 112 at position 143. Beam 142 has been deflected away from the optical axis 141 of column 140 by a deflector in column 140 (not shown). When beam 142 strikes the surface of substrate 112 at position 143, it causes the emission of SE/BSEs 144. The SE/BSEs 144 are collected by detector 145. Note that this is the desired situation since detector 145 corresponds to column 140—there is no intercolumn crosstalk due to beam 142.

Similarly, column 146 generates electron beam 148 which is focused by column 146 onto the surface of substrate 112 at position 149. Beam 148 has been deflected almost the maximum distance away from the optical axis 147 of column 146 by a deflector in column 146 (not shown). When beam 148 strikes the surface of substrate 112 at position 149, it causes the emission of SE/BSEs 150. The SE/BSEs 150 are collected by detectors 151 and 157. Note that this is undesirable— detector 157 should collect only SE/BSEs 156 generated by beam 154 in order to avoid crosstalk between columns 146 and 152.

Like columns 140 and 146, column 152 generates electron beam 154 which is focused by column 152 onto the surface of substrate 112 at position 155. Beam 154 has been deflected away from the optical axis 153 of column 152 by a deflector in column 152 (not shown). When beam 154 strikes the surface of substrate 112 at position 155, it causes the emission of SE/BSEs 156. The SE/BSEs 156 are collected by detector 157. Note that this is the desired situation since detector 157 corresponds to column 152.

In FIG. 1B, scan limits 160 and 161 show the maximum allowable range for position 143—this is the maximum extent of the deflection of beam 142 required to abut the scans generated by neighboring columns. For example, with an intercolumn spacing of 125 mm, limits 160 and 161 would be −62.5 mm and +62.5 mm from optical axis 141, respectively, where the displacement is parallel to the plane containing the optical axes 141, 147, and 153. Similarly, scan limits 161 and 162 define the maximum range for position 149, and limits 162 and 163 define the maximum range for position 155. Separator 164 is positioned between the ends of detectors 145 and 151, which are located as closely together as possible to provide a nearly continuous SE/BSE collection surface. Separator 164 is directly above scan limit 161. Similarly, separator 165 is directly above scan limit 162, and separator 166 is directly above scan limit 163. By positioning separators 164-166 directly above scan limits 161-163, respectively, the amount of crosstalk between columns is minimized but cannot be eliminated as shown in FIG. 1C.

FIG. 1C, is a close-up of a portion of FIG. 1B, showing the SE/BSEs 150 being collected by both detectors 151 and 157, thereby causing crosstalk between neighboring columns. The impact of primary beam 148 at position 149 on the surface of substrate 112 causes the emission of SE/BSEs 150. Because SE/BSEs 150 are emitted over a wide angular distribution, the endpoints of trajectories 150 in the plane of the collection surfaces of detectors 151 and 157 extend a distance 171 to the left of position 149 and a distance 172 to the right of position 149. Define L=the maximum of the two distances 171 and 172. For SEs, distances 171 and 172 would typically be the same, independent of any tilt in beam 148. For BSEs, however, when beam 148 is tilted as shown, distance 172 would be somewhat larger than distance 171 due to specular reflection effects, thus the most conservative definition is to set L to the larger of the two distances 171 and 172. Then, if the position of a primary beam is a distance greater than L away from either of the two scan limits for the column generating the primary beam (e.g., scan limits 160 and 161 for beam 142), as is the case for beam 142 in FIGS. 1A and 1B, all of the SE/BSEs 144 will be collected by the "correct" detector, where "correct" corresponds to the detector for the same column which generated the primary beam inducing the SE and/or BSE emission, i.e., detector 145 for column 140 generating beam 142 which causes SE/BSEs 144.

In the example in FIG. 1C, the beam landing position 149 is a distance less than L to the left of scan limit 162, thus a substantial portion (almost 50%) of SE/BSEs 150 are collected by detector 157 which corresponds to the neighboring column 152 (see FIGS. 1A and 1B). The portion of SE/BSEs 150 landing over the range 173 on detector 157 results in crosstalk between columns 146 and 152. Thus, comparison of FIGS. 12A-12B with FIGS. 1A-1B, shows that although lengthening the detectors in FIGS. 1A-1B has solved the problem of missing signals at the outer limits of the scans, it has introduced the problem of intercolumn crosstalk.

FIGS. 2-6 show five embodiments of the present invention, all demonstrating the simultaneous achievement of all three design requirements: high throughput, 100% pixel testing, and substantially no intercolumn crosstalk.

Figure 2:
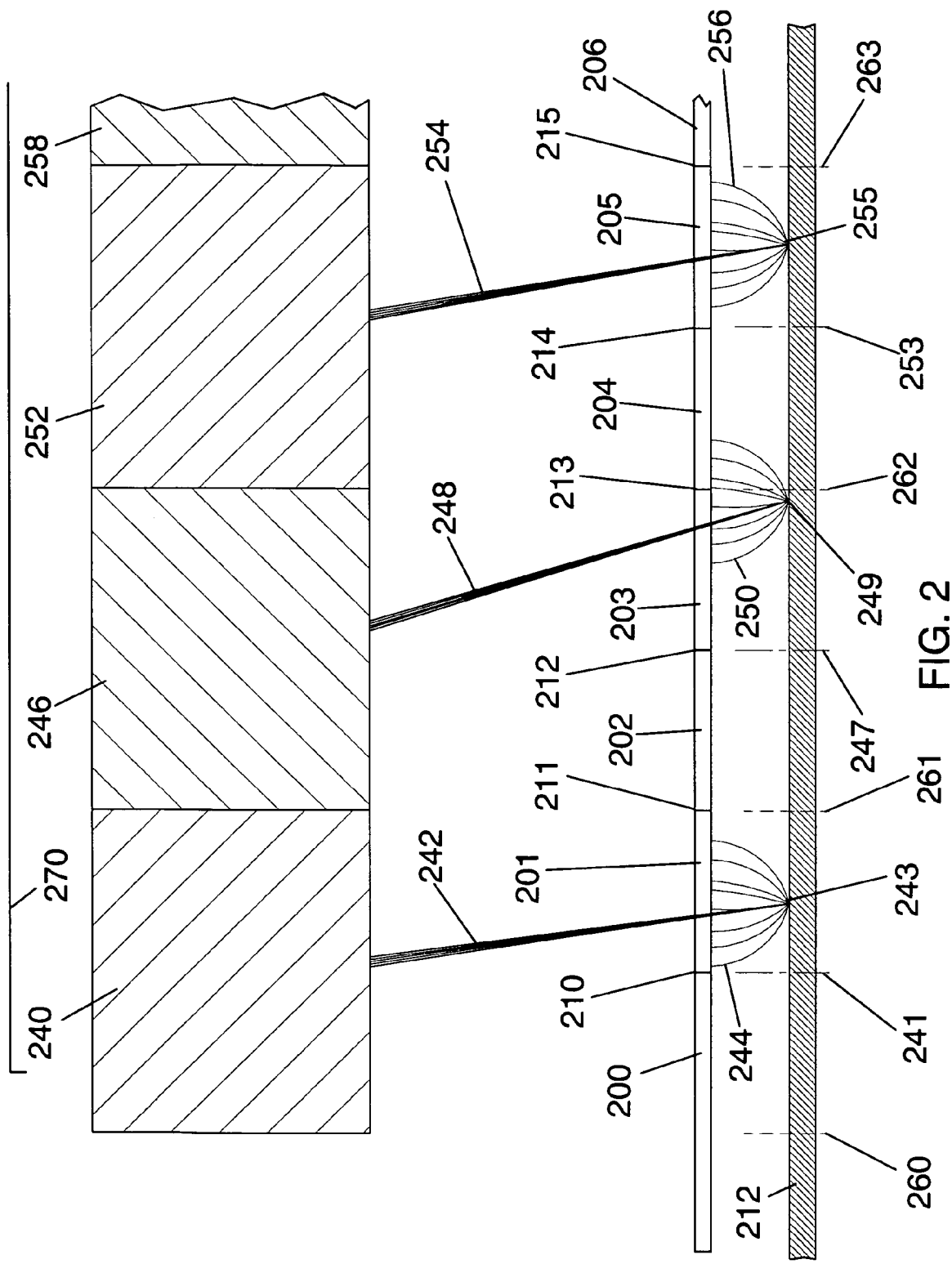
FIG. 2 is a schematic cross-sectional representation of a first embodiment of the present invention in a plane containing the optical axes of the multiple electron beam columns, illustrating two detectors for each column where the detectors are aligned with the columns.

FIG. 2 is a schematic cross-sectional representation of a first embodiment of the present invention through a plane containing optical axes 241, 247, and 253. Electron-beam column array 270 comprises columns 240, 246, 252, and 258. A linear detector array comprises detectors 200-206 with separators 210-215 as shown. The function of separators 210-215 is to provide electrical isolation between neighboring detectors. The same width and functionality considerations apply to separators 210-215 as applied to separators 164-166 shown in FIGS. 1A-1B. Note that detector 200, at the end of the detector array, has been extended to the left to ensure full collection of SE/BSEs 244 even when position 243 is at scan limit 260. Columns 240, 246, 252, and 258 may be identical to columns 140, 146, 152, and 158, respectively, as shown in FIGS. 1A-1B. Each of the columns in array 270 functions independently of the other columns. For example, column 240 generates electron beam 242 which is focused by column 240 onto the surface of substrate 212 at position 243. Beam 242 has been deflected away from the optical axis 241 of column 240 by a deflector in column 240 (not shown). When beam 242 strikes the surface of substrate 212 at position 243, beam 242 causes the emission of SE/BSEs 244. SE/BSEs 244 are collected by detector 201. Similarly, column 246 generates electron beam 248 which is focused by column 246 onto the surface of substrate 212 at position 249. Beam 248 has been deflected almost the maximum distance away from the optical axis 247 of column 246 by a deflector in column 246 (not shown). When beam 248 strikes the surface of substrate 212 at position 249, it causes the emission of SE/BSEs 250. SE/BSEs 250 are collected by detectors 203 and 204. Like columns 240 and 246, column 252 generates electron beam 254 which is focused by column 252 onto the surface of substrate 212 at position 255. Beam 254 has been deflected away from the optical axis 253 of column 252 by a deflector in column 252 (not shown). When beam 254 strikes the surface of substrate 212 at position 255, beam 254 causes the emission of SE/BSEs 256. SE/BSEs 256 are collected by detector 205.

Scan limits 260-263 correspond to scan limits 160-163, respectively, in FIG. 1B. The present invention corrects for intercolumn crosstalk by using multiple detectors for each column and dynamically selecting which detectors to use with each column. The selection of detectors depends on the positions of the beams on the substrate, as will be described below.

In order to determine how to select which detectors to use with each column, it is first necessary to introduce terminology relating to the scan width and the SE/BSE distribution at the detector. Define the width of the beam scan to be S. The description of FIG. 1C defines a second parameter, L, which is the extent to which SE/BSEs spread out from the substrate to the detector, so that at the detector, SE/BSEs land over a range of ±L from the location on the detector immediately above the beam position on the substrate surface (see FIG. 1C). Table I shows the column scan parameters for FIG. 2, including the positions of the optical axes, and the left and right scan limits for columns 240, 246, and 252.

TABLE I

FIG. 2 column parameters in units of the scan width, S.
FIG. 2 Column Scan Parameters

| Column Number | 240 | 246 | 252 |
|---|---|---|---|
| Optical Axis | 241 | 247 | 253 |
| Optical Axis Location | S/2 | 3 S/2 | 5 S/2 |
| Left Scan Limit | 260 | 261 | 262 |
| Left Scan Limit Location | 0 | S | 2 S |
| Right Scan Limit | 261 | 262 | 263 |
| Right Scan Limit Location | S | 2 S | 3 S |

For the embodiment of the present invention shown in FIG. 2, the number of columns in array 270 would be:

Number of Columns ≧ (width of substrate)/(width of scan field).

If the number of columns calculated with this formula is not an integer, it should be rounded up to the next highest integer. Assuming two detectors per column, the number of detectors would then be twice the number of columns.

Table IIA shows parameters for column 240, including the definitions of four regions A1-A4, which together constitute the full width, S, of the scan range for position 243 for the case where L/S is between 0 and 0.25. Assume that the columns have priorities starting with column 240 ($1^{st}$ priority), column 246 ($2^{nd}$ priority), column 252 ($3^{rd}$ priority), etc. where "priority" refers to which column has the most freedom to determine where it can position its respective beam. For example, position 243 can always be anywhere between scan limits 260 and 261, corresponding to regions A1-A4 in Table IIA, independent of where position 249 is. Table IIA shows that if position 243 is in region A1, only detector 200 is required to collect all of the SE/BSEs 244. In this case, position 249 can be anywhere between scan limits 261 and 262, corresponding to regions B1-B5 in Table IIIA. If, however, position 243 is in regions A2-A3, both detectors 200 and 201 are needed to collect SE/BSEs 244. Because any particular detector can only be used for collecting one group of SE/BSEs, if detector 201 is needed to collect SE/BSEs 244, then detector 201 cannot be used to collect SE/BSEs 250. This places a restriction on where position 249 can be. Position 249 cannot be in region B1 since Table IIIA shows that in this case, some of SE/BSEs 250 will fall on detector 201, causing unacceptable intercolumn crosstalk. Thus, position 249 must be in regions B2-B5. If position 243 is in region A4, then both detectors 201 and 202 are required to collect SE/BSEs 244. In this case, neither detector 201 nor detector 202 is available for the collection of SE/BSEs 250, and position 249 must be in regions B4-B5, where only detectors 203 and 204 are needed for the collection of SE/BSEs 250.

Similar considerations apply to the interaction of columns 246 and 252 in the case when L/S is between 0 and 0.25. When position 249 is in regions B1 or B2 in Table IIIA, position 255 may be anywhere between scan limits 262 and 263, corresponding to regions C1-C5 in Table IVA. If position 249 is in regions B3-B4, detector 203 is unavailable for the collection of SE/BSEs 256, and thus position 255 must be in regions C2-C5. If position 249 is in region B5, then detectors 203 and 204 are unavailable for the collection of SE/BSEs 256, and position 255 must be in regions C4-C5.

Tables IIB-IVB correspond to Tables IIA-IVA, for the case where L/S is in the range 0.25-0.50. A larger value for L/S corresponds to a proportionately wider distribution of SE/BSEs at the detectors, thus typically the SE/BSEs will tend to fall on more than one detector a larger percentage of the time. This can be seen by comparing Tables IIA-IVA with IIB-IVB—each "X" corresponds to the use of the detector shown at the top of the column for the detection of SE/BSEs falling within the region shown at the left of that row. A larger number of X's in a table corresponds to more detectors being used more of the time—this increases the chances for conflicts between neighboring columns vying for the use of any particular detector. Increased conflicts will result in a higher percentage value for the figure of merit, potentially leading to reduced system throughput.

For example, Table IIB shows that if position 243 is in region AA1, only detector 200 is required to collect all of the SE/BSEs 244. In this case, position 249 may be anywhere between scan limits 261 and 262, corresponding to regions BB1-BB5 in Table IIIB. If, however, position 243 is in region AA2, both detectors 200 and 201 are needed to collect SE/BSEs 244. Then position 249 must be within regions BB3-BB5 as shown in Table IIIB. If position 243 is in regions AA3-AA4, then both detectors 201 and 202 are required to collect SE/BSEs 244. In this case, position 249 must be within region BB5, where only detectors 203 and 204 are needed for the collection of SE/BSEs 250.

If L/S>0.5, detector 201 is always needed to collect SE/BSEs 244, so it is never possible for position 249 to be near separator 261 (which would require the use of detector 201 to collect SE/BSEs 250)—this in an unresolvable intercolumn conflict. Thus, when the scan fields of neighboring columns abut, it is always necessary for L/S to fall below 0.5. System performance is generally improved with lower L/S values. Lower L/S values can be obtained in several (nonexclusive) ways, such as reducing the gap between the substrate surface and the detector optics or by applying a higher attractive bias voltage on the detector optics relative to the substrate voltage (see U.S. patent application Ser. No. 11/093,000 filed Mar. 28, 2005).

Figure 10:
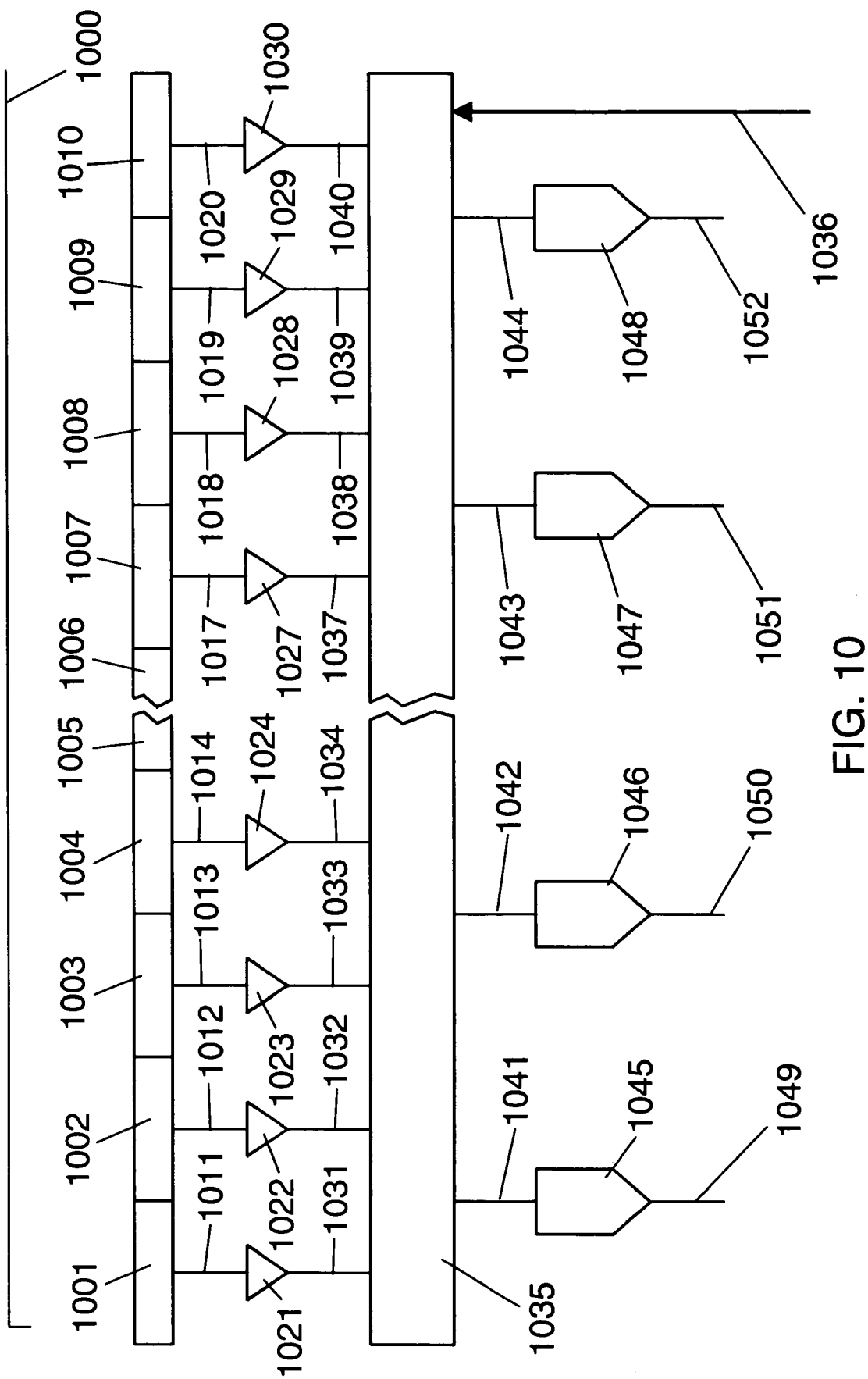
FIG. 10 is a schematic block diagram of an electronic detector optics circuit for use with any of the embodiments of the present invention.
Figure 11:
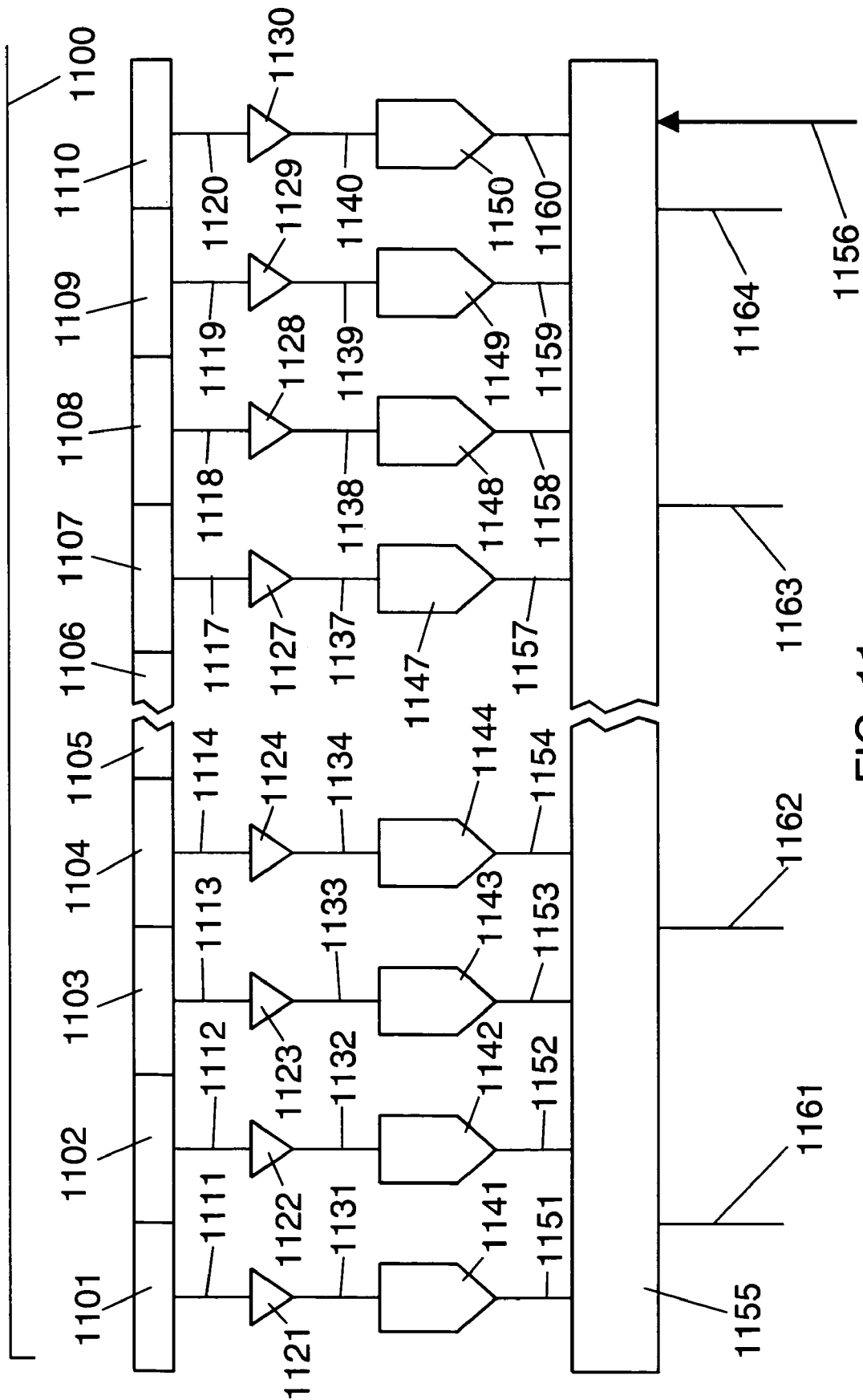
FIG. 11 is a schematic block diagram of an alternative electronic detector optics circuit for use with any of the embodiments of the present invention.

The detector selection process shown in Tables IIA-IVB would be implemented in either the analog signal combiner 1035 in FIG. 10 or in the digital signal combiner 1155 in FIG. 11.

TABLE IIA

Collection of SE/BSEs 244 depending on the position 243 of the beam 242 on the substrate surface 212 for L/S between 0 and 0.25.
Column 240 SE/BSE Collection for 0 < L/S < 0.25

| Region | Position 243 Range | | Detectors Collecting SE/BSEs 244 | | |
|---|---|---|---|---|---|
| | Left | Right | 200 | 201 | 202 |
| A1 | 0 | S/2 − L | X | | |
| A2 | S/2 − L | S/2 + L | X | X | |
| A3 | S/2 + L | S − L | | X | |
| A4 | S − L | S | | X | X |

TABLE IIB

Collection of SE/BSEs 244 depending on the position 243 of the beam 242 on the substrate surface 212 for L/S between 0.25 and 0.50.
Column 240 SE/BSE Collection for 0.25 < L/S < 0.50

| Region | Position 243 Range | | Detectors Collecting SE/BSEs 244 | | |
|---|---|---|---|---|---|
| | Left | Right | 200 | 201 | 202 |
| AA1 | 0 | S/2 − L | X | | |
| AA2 | S/2 − L | S − L | X | X | |

TABLE IIB-continued

Collection of SE/BSEs 244 depending on the position 243 of the beam 242 on the substrate surface 212 for L/S between 0.25 and 0.50. Column 240 SE/BSE Collection for 0.25 < L/S < 0.50

| Region | Position 243 Range Left | Right | Detectors Collecting SE/BSEs 244 200 | 201 | 202 |
|---|---|---|---|---|---|
| AA3 | S – L | S/2 + L | X | X | X |
| AA4 | S/2 + L | S | | X | X |

TABLE IIIA

Collection of SE/BSEs 250 depending on the position 249 of the beam 248 on the substrate surface 212 for L/S between 0 and 0.25. Column 246 SE/BSE Collection for 0 < L/S < 0.25

| Region | Position 249 Range Left | Right | Detectors Collecting SE/BSEs 250 201 | 202 | 203 | 204 |
|---|---|---|---|---|---|---|
| B1 | S | S + L | X | X | | |
| B2 | S + L | 3 S/2 – L | | X | | |
| B3 | 3 S/2 – L | 3 S/2 + L | | X | X | |
| B4 | 3 S/2 + L | 2 S – L | | | X | |
| B5 | 2 S – L | 2 S | | | X | X |

TABLE IIIB

Collection of SE/BSEs 250 depending on the position 249 of the beam 248 on the substrate surface 212 for L/S between 0.25 and 0.50. Column 246 SE/BSE Collection for 0.25 < L/S < 0.50

| Region | Position 249 Range Left | Right | Detectors Collecting SE/BSEs 250 201 | 202 | 203 | 204 |
|---|---|---|---|---|---|---|
| BB1 | S | 3 S/2 – L | X | X | | |
| BB2 | 3 S/2 – L | S + L | X | X | X | |
| BB3 | S + L | 2 S – L | | X | X | |
| BB4 | 2 S – L | 3 S/2 + L | | X | X | X |
| BB5 | 3 S/2 + L | 2 S | | | X | X |

TABLE IVA

Collection of SE/BSEs 256 depending on the position 255 of the beam 254 on the substrate surface 212 for L/S between 0 and 0.25. Column 252 SE/BSE Collection for 0 < L/S < 0.25

| Region | Position 255 Range Left | Right | Detectors Collecting SE/BSEs 256 203 | 204 | 205 | 206 |
|---|---|---|---|---|---|---|
| C1 | 2 S | 2 S + L | X | X | | |
| C2 | 2 S + L | 5 S/2 – L | | X | | |
| C3 | 5 S/2 – L | 5 S/2 + L | | X | X | |
| C4 | 5 S/2 + L | 3 S – L | | | X | |
| C5 | 3 S – L | 3 S | | | X | X |

TABLE IVB

Collection of SE/BSEs 256 depending on the position 255 of the beam 254 on the substrate surface 212 for L/S between 0.25 and 0.50. Column 252 SE/BSE Collection for 0.25 < L/S < 0.50

| Region | Position 255 Range Left | Right | Detectors Collecting SE/BSEs 256 203 | 204 | 205 | 206 |
|---|---|---|---|---|---|---|
| CC1 | 2 S | 5 S/2 – L | X | X | | |
| CC2 | 5 S/2 – L | 2 S + L | X | X | X | |
| CC3 | 2 S + L | 3 S – L | | X | X | |
| CC4 | 3 S – L | 5 S/2 + L | | X | X | X |
| CC5 | 5 S/2 + L | 3 S | | | X | X |

Figure 3:
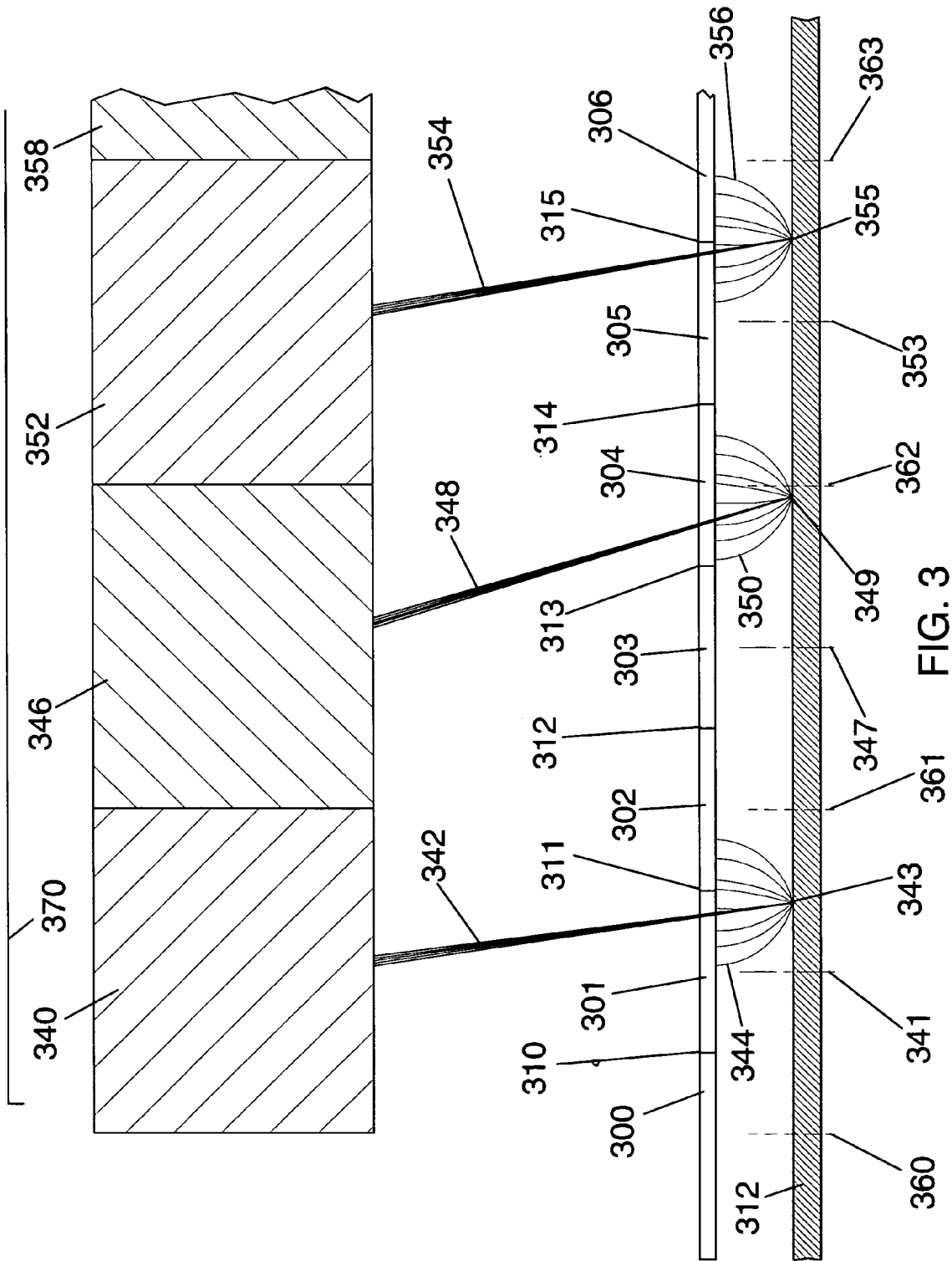
FIG. 3 is a schematic cross-sectional representation of a second embodiment of the present invention in a plane containing the optical axes of the multiple electron beam columns, illustrating two detectors for each beam where the detectors are shifted with respect to the columns.

FIG. 3 is a schematic cross-sectional representation of a second embodiment of the present invention through a plane containing optical axes 341, 347, and 353. Electron-beam column array 370 comprises columns 340, 346, 352, and 358. A linear detector array comprises detectors 300-306 with separators 310-315 as shown. The function of separators 310-315 is to provide electrical isolation between neighboring detectors. The same width and functionality considerations apply to separators 310-315 as applied to separators 164-166 shown in FIGS. 1A-1B. Note that detector 300, at the end of the detector array, has been extended to the left to ensure full collection of SE/BSEs 344 even when position 343 is at scan limit 360. Columns 340, 346, 352, and 358 may be identical to columns 140, 146, 152, and 158, respectively, as found in FIGS. 1A-1B. Each of the columns in array 370 functions independently of the other columns. For example, column 340 generates electron beam 342 which is focused by column 340 onto the surface of substrate 312 at position 343. Beam 342 has been deflected away from the optical axis 341 of column 340 by a deflector in column 340 (not shown). When beam 342 strikes the surface of substrate 312 at position 343, beam 342 causes the emission of SE/BSEs 344. SE/BSEs 344 are collected by detectors 301 and 302. Similarly, column 346 generates electron beam 348 which is focused by column 346 onto the surface of substrate 312 at position 349. Beam 348 has been deflected almost the maximum distance away from the optical axis 347 of column 346 by a deflector in column 346 (not shown). When beam 348 strikes the surface of substrate 312 at position 349, it causes the emission SE/BSEs 350. SE/BSEs 350 are collected by detector 304. Like columns 340 and 346, column 352 generates electron beam 354 which is focused by column 352 onto the surface of substrate 312 at position 355. Beam 354 has been deflected away from the optical axis 353 of column 352 by a deflector in column 352 (not shown). When beam 354 strikes the surface of substrate 312 at position 355, beam 354 causes the emission of SE/BSEs 356. SE/BSEs 356 are collected by detectors 305 and 306.

Scan limits 360-363 correspond to scan limits 160-163, respectively, in FIG. 1B. The second embodiment of the present invention differs from the first embodiment solely in the arrangement of the individual detectors 300-306. The method for correction of intercolumn crosstalk is the same as for the first embodiment: dynamic selection of which detectors to use with each column depending on the positions of the beams on the substrate. The same two parameters, L and S, are used to characterize the second embodiment. Table V shows the column scan parameters for FIG. 3. The formula for calculating the number of columns is the same as for the first embodiment, however, the number of detectors is twice the number of columns plus one.

TABLE V

FIG. 3 column parameters in units of the scan width, S.
FIG. 3 Column Scan Parameters

| Column Number | 340 | 346 | 352 |
|---|---|---|---|
| Optical Axis | 341 | 347 | 353 |
| Optical Axis Location | S/2 | 3 S/2 | 5 S/2 |
| Left Scan Limit | 360 | 361 | 362 |
| Left Scan Limit Location | 0 | S | 2 S |
| Right Scan Limit | 361 | 362 | 363 |
| Right Scan Limit Location | S | 2 S | 3 S |

Table VI shows parameters for column 340, including the definitions of five regions D1-D5, which together constitute the full width, S, of the scan range for position 343 for the case where L/S is between 0 and 0.25. Assume that the columns have priorities starting with column 340 (1$^{st}$ priority), column 346 (2$^{nd}$ priority), column 352 (3$^{rd}$ priority), etc. where "priority" has the same definition as for FIG. 2. For example, position 343 can always be anywhere between scan limits 360 and 361, corresponding to regions D1-D5 in Table VI, independent of where position 349 is. Table VI shows that if position 343 is in regions D1-D3, only detectors 300 and/or 301 are required to collect all of the SE/BSEs 344. In this case, position 349 can be anywhere between scan limits 361 and 362, corresponding to regions E1-E5 in Table VII. If, however, position 343 is in regions D 4 -D 5, detector 302 is needed to collect some or all of SE/BSEs 344. Then position 349 cannot be in regions E1 -E2 since Table VII shows that in this case, some or all of SE/BSEs 350 will fall on detector 302, causing undesirable intercolumn crosstalk. Thus, in this case position 349 must be in regions E3-E5.

TABLE VI

Collection of SE/BSEs 344 depending on the position 343 of the beam 342 on the substrate surface 312 for L/S between 0 and 0.25.
Column 340 SE/BSE Collection for 0 < L/S < 0.25

| | Position 343 Range | | Detectors Collecting SE/BSEs 344 | | |
|---|---|---|---|---|---|
| Region | Left | Right | 300 | 301 | 302 |
| D1 | 0 | S/4 − L | X | | |
| D2 | S/4 − L | S/4 + L | X | X | |
| D3 | S/4 + L | 3 S/4 − L | | X | |
| D4 | 3 S/4 − L | 3 S/4 + L | | X | X |
| D5 | 3 S/4 + L | S | | | X |

TABLE VII

Collection of SE/BSEs 350 depending on the position 349 of the beam 348 on the substrate surface 312 for L/S between 0 and 0.25.
Column 346 SE/BSE Collection for 0 < L/S < 0.25

| | Position 349 Range | | Detectors Collecting SE/BSEs 350 | | |
|---|---|---|---|---|---|
| Region | Left | Right | 302 | 303 | 304 |
| E1 | S | 5 S/4 − L | X | | |
| E2 | 5 S/4 − L | 5 S/4 + L | X | X | |
| E3 | 5 S/4 + L | 7 S/4 − L | | X | |
| E4 | 7 S/4 − L | 7 S/4 + L | | X | X |
| E5 | 7 S/4 + L | 2 S | | | X |

Similar considerations apply to the interaction of columns 346 and 352. In systems with more than three columns, the column priorities would descend in order across the linear array of columns and more tables could be generated similar to Table VII. The same beam scanning restrictions would apply to all of these columns as outlined above for columns 340 and 346. The detector selection process shown in Tables VI-VII would be implemented in either the analog signal combiner 1035 in FIG. 10 or in the digital signal combiner 1155 in FIG. 11.

As in FIG. 2, Tables VIIIA and VIIIB describe the collection of SEs/BSEs 344 and 350 in FIG. 3 when L/S is in the range from 0.25 to 0.50. These tables show that the second embodiment in FIG. 3 cannot be used for L/S>0.25 since, in these cases, there is always an unresolvable conflict between neighboring columns for the usage of the center detectors 301, 303, and 305. Table VIIIA shows that detector 301 is needed to collect SE/BSEs 344 whenever position 343 is in regions DD1-DD4, which constitutes the full scan width S. Thus it is never possible to collect SE/BSEs 350 from region EE1 (see Table VIIIB) using detector 301 since detector 301 is always in use for collection of SE/BSEs 344, instead. This illustrates an unresolvable intercolumn conflict. Curve 704 in the graph in FIG. 7 ends at point 708 (L/S=0.25) for this reason, while curve 703, corresponding to FIG. 2, extends all the way to L/S=0.50. Above L/S=0.50, there is no multiple detector design which avoids unresolvable intercolumn conflicts.

TABLE VIIIA

Collection of SE/BSEs 344 depending on the position 343 of beam 342 on the substrate surface 312 for L/S between 0.25 and 0.50.
Column 340 SE/BSE Collection for 0.25 < L/S < 0.50

| | Position 343 Range | | Detectors Collecting SE/BSEs 344 | | | |
|---|---|---|---|---|---|---|
| Region | Left | Right | 300 | 301 | 302 | 303 |
| DD1 | 0 | 3 S/4 − L | X | X | | |
| DD2 | 3 S/4 − L | S/4 + L | X | X | X | |
| DD3 | S/4 + L | 5 S/4 − L | | X | X | |
| DD4 | 5 S/4 − L | S | | X | X | X |

TABLE VIIIB

Collection of SE/BSEs 350 depending on the position 349 of beam 348 on the substrate surface 312 for L/S between 0.25 and 0.50.
Column 346 SE/BSE Collection for 0.25 < L/S < 0.50

| | Position 349 Range | | Detectors Collecting SE/BSEs 350 | | | | |
|---|---|---|---|---|---|---|---|
| Region | Left | Right | 301 | 302 | 303 | 304 | 305 |
| EE1 | S | 3 S/4 + L | X | X | X | | |
| EE2 | 3 S/4 + L | 7 S/4 − L | | X | X | | |
| EE3 | 7 S/4 − L | 5 S/4 + L | | X | X | X | |
| EE4 | 5 S/4 + L | 9 S/4 − L | | | X | X | |
| EE5 | 9 S/4 − L | 2 S | | | X | X | X |

Figure 4:
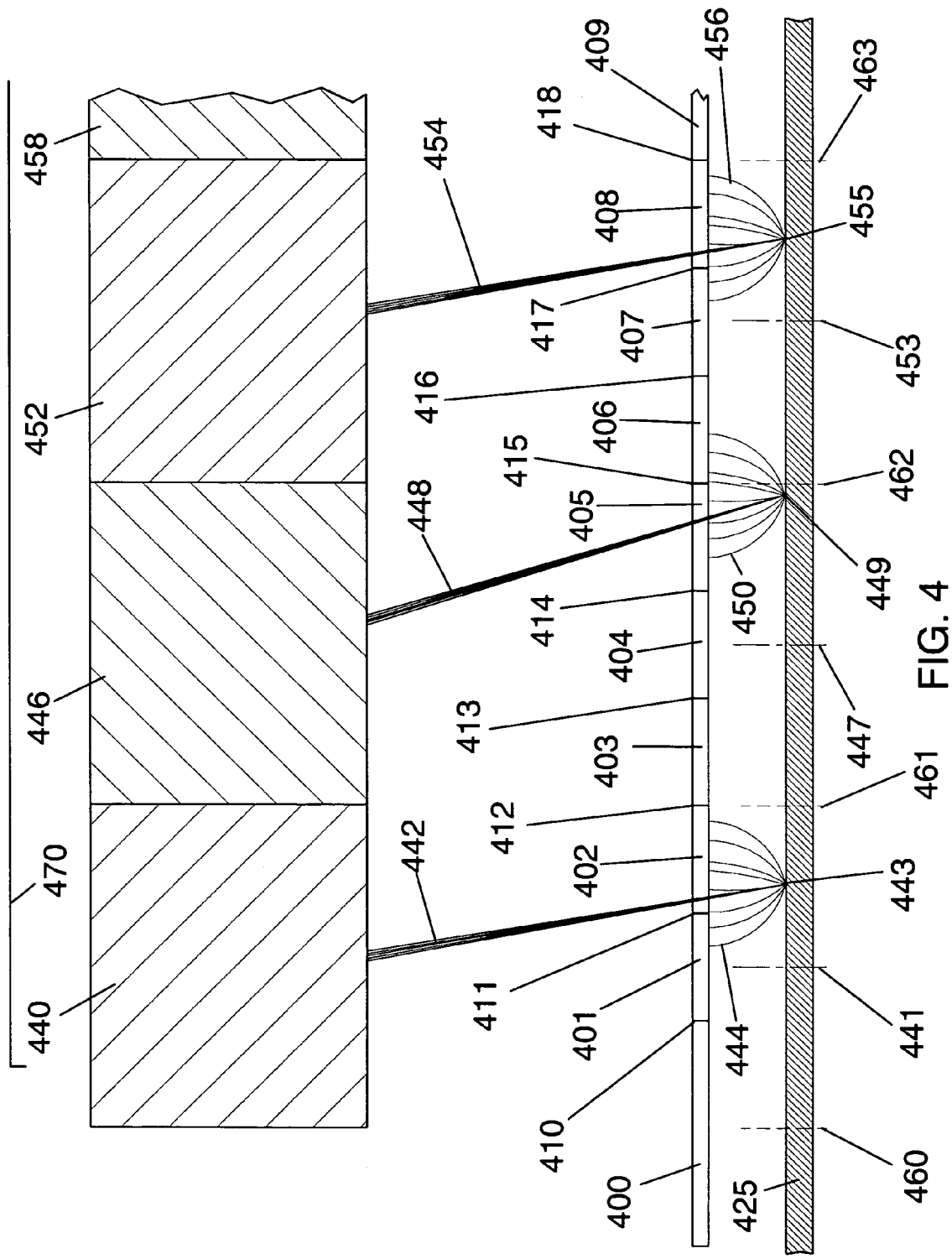
FIG. 4 is a schematic cross-sectional representation of a third embodiment of the present invention in a plane containing the optical axes of the multiple electron beam columns, illustrating three detectors for each column where the detectors are aligned with the columns.

FIG. 4 is a schematic cross-sectional representation of a third embodiment of the present invention through a plane containing optical axes 441, 447, and 453. Electron-beam column array 470 comprises columns 440, 446, 452, and 458. A linear detector array comprises detectors 400-409 with separators 410-418 as shown. The function of separators 410-418 is to provide electrical isolation between neighboring detectors. The same width and functionality considerations apply to separators 410-418 as applied to separators 164-166 shown in FIGS. 1A-1B. Note that detector 400, at the end of the detector array, has been extended to the left to ensure full collection of SE/BSEs 444 even when position 443 is at scan limit 460. Columns 440, 446, 452, and 458 may be identical to columns 140, 146, 152, and 158, respectively, as found in FIGS. 1A-1B. Each of the columns in array 470 functions independently of the other columns. For example, column 440 generates electron beam 442 which is focused by column 440 onto the surface of substrate 425 at position 443. Beam 442 has been deflected away from the optical axis 441 of column 440 by a deflector in column 440 (not shown). When beam 442 strikes the surface of substrate 425 at position 443, beam 442 causes the emission of SE/BSEs 444. SE/BSEs 444 are collected by detectors 401 and 402. Similarly, column 446 generates electron beam 448 which is focused by column 446 onto the surface of substrate 425 at position 449. Beam 448 has been deflected almost the maximum distance away from the optical axis 447 of column 446 by a deflector in column 446 (not shown). When beam 448 strikes the surface of substrate 425 at position 449, it causes the emission of SE/BSEs 450. SE/BSEs 450 are collected by detectors 405 and 406. Like columns 440 and 446, column 452 generates electron beam 454 which is focused by column 452 onto the surface of substrate 425 at position 455. Beam 454 has been deflected away from the optical axis 453 of column 452 by a deflector in column 452 (not shown). When beam 454 strikes the surface of substrate 425 at position 455, beam 454 causes the emission of SE/BSEs 456. SE/BSEs 456 are collected by detectors 407 and 408.

Scan limits 460-463 correspond to scan limits 160-163, respectively, in FIG. 1B. The formula for calculating the number of columns is the same as for the first embodiment. The third embodiment of the present invention differs from the first embodiment in the number of detectors per column (3 instead of 2), making the number of detectors three times the number of columns. The method for correction of intercolumn crosstalk is the same as for the first and second embodiments: dynamic selection of which detectors to use with each column depending on the positions of the beams on the substrate. The same definitions for the width of the beam scan, S, and the SE/BSE range parameter, L, are used as for FIGS. 2-3. Table IX shows the column scan parameters for FIG. 4.

TABLE IX

FIG. 4 column parameters in units of the scan width, S.
FIG. 4 Column Scan Parameters

| Column Number | 440 | 446 | 452 |
|---|---|---|---|
| Optical Axis | 441 | 447 | 453 |
| Optical Axis Location | S/2 | 3 S/2 | 5 S/2 |
| Left Scan Limit | 460 | 461 | 462 |
| Left Scan Limit Location | 0 | S | 2 S |
| Right Scan Limit | 461 | 462 | 463 |
| Right Scan Limit Location | S | 2 S | 3 S |

Table X shows parameters for column 440, including the definitions of six regions G1-G6, which together constitute the full width, S, of the scan range for position 443 for the case where L/S is between 0 and ⅙. Assume that the columns have priorities starting with column 440 (1$^{st}$ priority), column 446 (2$^{nd}$ priority), column 452 (3$^{rd}$ priority), etc. where "priority" has the same definition as for FIGS. 2-3. The same beam scanning restrictions would apply to columns 440, 446, and 452 as outlined above for columns 240, 246 and 252. The detector selection process shown in Tables X-XII would be implemented in either the analog signal combiner 1035 in FIG. 10 or in the digital signal combiner 1155 in FIG. 11.

TABLE X

Collection of SE/BSEs 444 depending on the position 443 of beam 442 on the substrate surface 425 for L/S between 0 and 1/6.
Column 440 SE/BSE Collection for 0 < L/S < 1/6

| | Position 443 Range | | Detectors Collecting SE/BSEs 444 | | | |
|---|---|---|---|---|---|---|
| Region | Left | Right | 400 | 401 | 402 | 403 |
| G1 | 0 | S/3 − L | X | | | |
| G2 | S/3 − L | S/3 + L | X | X | | |
| G3 | S/3 + L | 2 S/3 − L | | X | | |
| G4 | 2 S/3 − L | 2 S/3 + L | | X | X | |
| G5 | 2 S/3 + L | S − L | | | X | |
| G6 | S − L | S | | | X | X |

TABLE XI

Collection of SE/BSEs 450 depending on the position 449 of beam 448 on the substrate surface 425 for L/S between 0 and 1/6.
Column 446 SE/BSE Collection for 0 < L/S < 1/6

| | Position 449 Range | | Detectors Collecting SE/BSEs 450 | | | | |
|---|---|---|---|---|---|---|---|
| Region | Left | Right | 402 | 403 | 404 | 405 | 406 |
| H1 | S | S + L | X | X | | | |
| H2 | S + L | 4 S/3 − L | | X | | | |
| H3 | 4 S/3 − L | 4 S/3 + L | | X | X | | |
| H4 | 4 S/3 + L | 5 S/3 − L | | | X | | |
| H5 | 5 S/3 − L | 5 S/3 + L | | | X | X | |
| H6 | 5 S/3 + L | 2 S − L | | | | X | |
| H7 | 2 S − L | 2 S | | | | X | X |

TABLE XII

Collection of SE/BSEs 456 depending on the position 455 of beam 454 on the substrate surface 425 for L/S between 0 and 1/6.
Column 452 SE/BSE Collection for 0 < L/S < 1/6

| | Position 455 Range | | Detectors Collecting SE/BSEs 456 | | | | |
|---|---|---|---|---|---|---|---|
| Region | Left | Right | 405 | 406 | 407 | 408 | 409 |
| I1 | 2 S | 2 S + L | X | X | | | |
| I2 | 2 S + L | 7 S/3 − L | | X | | | |
| I3 | 7 S/3 − L | 7 S/3 + L | | X | X | | |
| I4 | 7 S/3 + L | 8 S/3 − L | | | X | | |
| I5 | 8 S/3 − L | 8 S/3 + L | | | X | X | |
| I6 | 8 S/3 + L | 3 S − L | | | | X | |
| I7 | 3 S − L | 3 S | | | | X | X |

Similar to the case for FIG. 2, different tables (not shown) describe the collection of SEs/BSEs for L/S in the range from ⅙ to 0.50. However, these tables show that the embodiment in FIG. 4 cannot be used for L/S>⅓ since, in these cases, there is always an unresolvable conflict between neighboring columns for the usage of the center detectors 401, 404, and 407. Curve 808 in the graph in FIG. 8 ends at L/S=⅓ for this reason, while curve 804, corresponding to FIG. 5, extends all the way to L/S=0.50.

Figure 5:
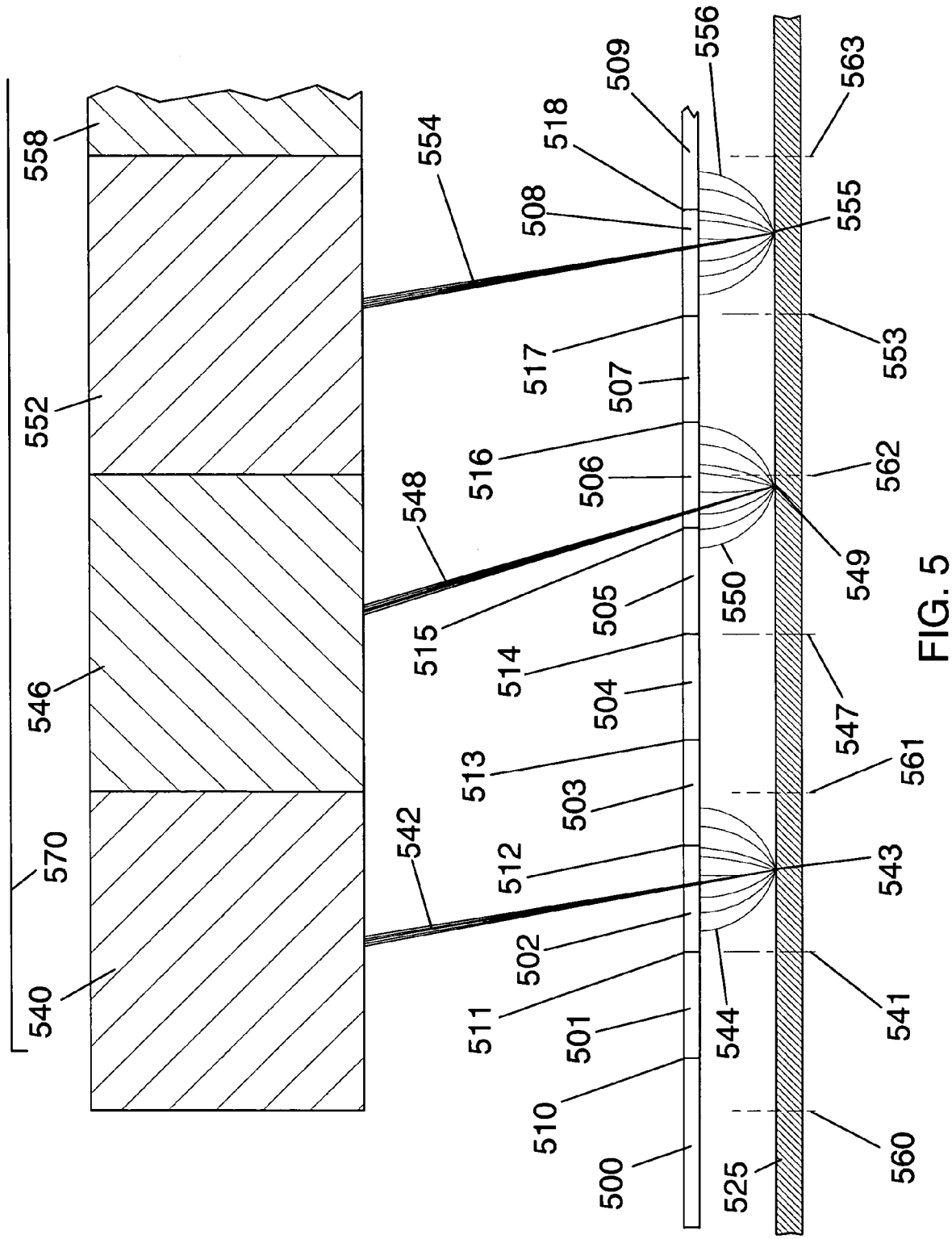
FIG. 5 is a schematic cross-sectional representation of a fourth embodiment of the present invention in a plane containing the optical axes of the multiple electron beam columns, illustrating three detectors for each column where the detectors are shifted with respect to the columns.

FIG. 5 is a schematic cross-sectional representation of a fourth embodiment of the present invention through a plane containing optical axes 541, 547, and 553. Electron-beam column array 570 comprises columns 540, 546, 552, and 558. A linear detector array comprises detectors 500-509 with separators 510-518 as shown. The function of separators 510-518 is to provide electrical isolation between neighboring detectors. The same width and functionality considerations apply to separators 510-518 as applied to separators 164-166 shown in FIGS. 1A-1B. Note that detector 500, at the end of the detector array, has been extended to the left to ensure full collection of SE/BSEs 544 even when position 543 is at scan limit 560. Columns 540, 546, 552, and 558 may be identical to columns 140, 146, 152, and 158, respectively, as found in FIGS. 1A-1B. Each of the columns in array 570 functions independently of the other columns. For example, column 540 generates electron beam 542 which is focused by column 540 onto the surface of substrate 525 at position 543. Beam 542 has been deflected away from the optical axis 541 of column 540 by a deflector in column 540 (not shown). When beam 542 strikes the surface of substrate 525 at position 543, beam 542 causes the emission of SE/BSEs 544. SE/BSEs 544 are collected by detectors 502 and 503. Similarly, column 546 generates electron beam 548 which is focused by column 546 onto the surface of substrate 525 at position 549. Beam 548 has been deflected almost the maximum distance away from the optical axis 547 of column 546 by a deflector in column 546 (not shown). When beam 548 strikes the surface of substrate 525 at position 549, it causes the emission of SE/BSEs 550. SE/BSEs 550 are collected by detectors 505 and 506. Like columns 540 and 546, column 552 generates electron beam 554 which is focused by column 552 onto the surface of substrate 525 at position 555. Beam 554 has been deflected away from the optical axis 553 of column 552 by a deflector in column 552 (not shown). When beam 554 strikes the surface of substrate 525 at position 555, beam 554 causes the emission of SE/BSEs 556. SE/BSEs 556 are collected by detectors 508 and 509.

Scan limits 560-563 correspond to scan limits 160-163, respectively, in FIG. 1B. The formula for calculating the number of columns is the same as for the first embodiment. The fourth embodiment of the present invention differs from the third embodiment solely in the arrangement of the individual detectors 500-509. The number of detectors is three times the number of columns plus one. The method for correction of intercolumn crosstalk is the same as for the earlier embodiments: dynamic selection of which detectors to use with each column depending on the positions of the beams on the substrate. The same definitions for the width of the beam scan, S, and the SE/BSE range parameter, L, are used as for FIGS. 2-4. Table XIII shows the column scan parameters for FIG. 5.

TABLE XIII

FIG. 5 column parameters in units of the scan width, S.
FIG. 5 Column Scan Parameters

| Column Number | 540 | 546 | 552 |
|---|---|---|---|
| Optical Axis | 541 | 547 | 553 |
| Optical Axis Location | S/2 | 3 S/2 | 5 S/2 |
| Left Scan Limit | 560 | 561 | 562 |
| Left Scan Limit Location | 0 | S | 2 S |
| Right Scan Limit | 561 | 562 | 563 |
| Right Scan Limit Location | S | 2 S | 3 S |

Table XIV shows parameters for column 540, including the definitions of seven regions J1-J7, which together constitute the full width, S, of the scan range for position 543 for the case where L/S is between 0 and ⅙. Assume that the columns have priorities starting with column 540 (1$^{st}$ priority), column 546 (2$^{nd}$ priority), column 552 (3$^{rd}$ priority), etc. where "priority" has the same definition as for FIGS. 2-4. The same beam scanning restrictions would apply to columns 540, 546, and 552 as outlined above for columns 240, 246 and 252. The detector selection process shown in Tables XIV-XVI would be implemented in either the analog signal combiner 1035 in FIG. 10 or in the digital signal combiner 1155 in FIG. 11.

TABLE XIV

Collection of SE/BSEs 544 depending on the position 543 of beam 542 on the substrate surface 525 for L/S between 0 and 1/6.
Column 540 SE/BSE Collection for 0 < L/S < 1/6

| | Position 543 Range | | Detectors Collecting SE/BSEs 544 | | | |
|---|---|---|---|---|---|---|
| Region | Left | Right | 500 | 501 | 502 | 503 |
| J1 | 0 | S/6 – L | X | | | |
| J2 | S/6 – L | S/6 + L | X | X | | |
| J3 | S/6 + L | S/2 – L | | X | | |
| J4 | S/2 – L | S/2 + L | | X | X | |
| J5 | S/2 + L | 5 S/6 – L | | | X | |
| J6 | 5 S/6 – L | 5 S/6 + L | | | X | X |
| J7 | 5 S/6 + L | S | | | | X |

TABLE XV

Collection of SE/BSEs 550 depending on the position 549 of beam 548 on the substrate surface 525 for L/S between 0 and 1/6.
Column 546 SE/BSE Collection for 0 < L/S < 1/6

| | Position 549 Range | | Detectors Collecting SE/BSEs 550 | | | |
|---|---|---|---|---|---|---|
| Region | Left | Right | 503 | 504 | 505 | 506 |
| K1 | S | 7 S/6 – L | X | | | |
| K2 | 7 S/6 – L | 7 S/6 + L | X | X | | |
| K3 | 7 S/6 + L | 3 S/2 – L | | X | | |
| K4 | 3 S/2 – L | 3 S/2 + L | | X | X | |
| K5 | 3 S/2 + L | 11 S/6 – L | | | X | |
| K6 | 11 S/6 – L | 11 S/6 + L | | | X | X |
| K7 | 11 S/6 + L | 2 S | | | | X |

TABLE XVI

Collection of SE/BSEs 556 depending on the position 555 of beam 554 on the substrate surface 525 for L/S between 0 and 1/6.
Column 552 SE/BSE Collection for 0 < L/S < 1/6

| | Position 555 Range | | Detectors Collecting SE/BSEs 556 | | | |
|---|---|---|---|---|---|---|
| Region | Left | Right | 506 | 507 | 508 | 509 |
| L1 | 2 S | 13 S/6 – L | X | | | |
| L2 | 13 S/6 – L | 13 S/6 + L | X | X | | |
| L3 | 13 S/6 + L | 5 S/2 – L | | X | | |
| L4 | 5 S/2 – L | 5 S/2 + L | | X | X | |
| L5 | 5 S/2 + L | 17 S/6 – L | | | X | |
| L6 | 17 S/6 – L | 17 S/6 + L | | | X | X |
| L7 | 17 S/6 + L | 3 S | | | | X |

Similar to the case for FIG. 2, different tables (not shown) describe the collection of SEs/BSEs for L/S in the range from ⅙ to 0.50. These tables show that the embodiment in FIG. 5 can be used for L/S<0.50. For L/S>0.50, there is always an unresolvable conflict between neighboring columns.

Figure 6:
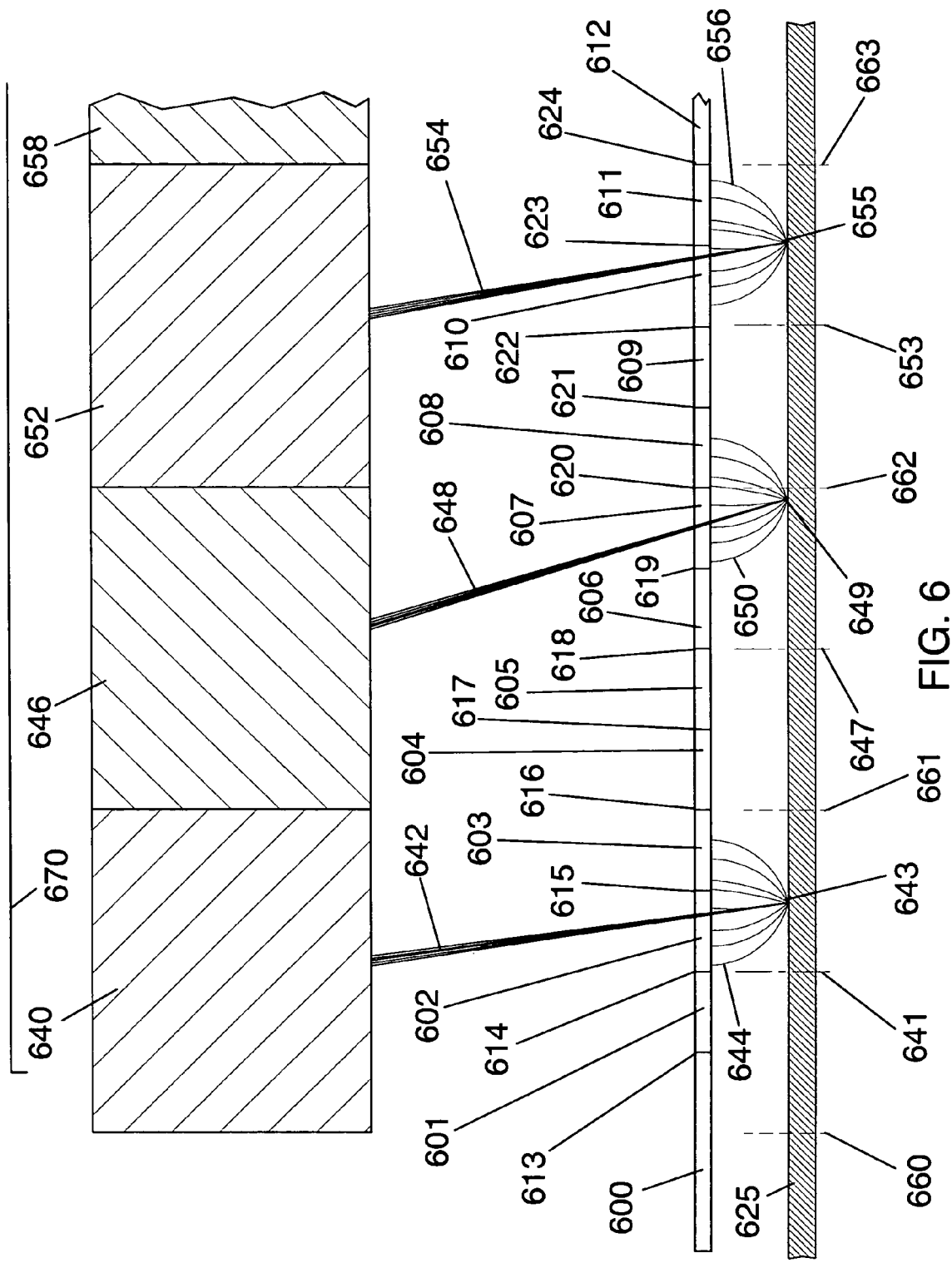
FIG. 6 is a schematic cross-sectional representation of a fifth embodiment of the present invention in a plane containing the optical axes of the multiple electron beam columns, illustrating four detectors for each column where the detectors are aligned with the columns.

FIG. 6 is a schematic cross-sectional representation of a fifth embodiment of the present invention through a plane containing optical axes 641, 647, and 653. Electron-beam column array 670 comprises columns 640, 646, 652, and 658. A linear detector array comprises detectors 600-612 with separators 613-624 as shown. The function of separators 613-624 is to provide electrical isolation between neighboring detectors. The same width and functionality considerations apply to separators 613-624 as applied to separators 164-166 shown in FIGS. 1A-1B. Note that detector 600, at the end of the detector array, has been extended to the left to ensure full collection of SE/BSEs 644 even when position 643 is at scan limit 660. Columns 640, 646, 652, and 658 may be identical to columns 140, 146, 152, and 158, respectively, as found in FIGS. 1A-1B. Each of the columns in array 670 functions independently of the other columns. For example, column 640 generates electron beam 642 which is focused by column 640 onto the surface of substrate 625 at position 643. Beam 642 has been deflected away from the optical axis 641 of column 640 by a deflector in column 640 (not shown). When beam 642 strikes the surface of substrate 625 at position 643, beam 642 causes the emission of SE/BSEs 644. SE/BSEs 644 are collected by detectors 602 and 603. Similarly, column 646 generates electron beam 648 which is focused by column 646 onto the surface of substrate 625 at position 649. Beam 648 has been deflected almost the maximum distance away from the optical axis 647 of column 646 by a deflector in column 646 (not shown). When beam 648 strikes the surface of substrate 625 at position 649, it causes the emission of SE/BSEs 650. SE/BSEs 650 are collected by detectors 607 and 608. Like columns 640 and 646, column 652 generates electron beam 654 which is focused by column 652 onto the surface of substrate 625 at position 655. Beam 654 has been deflected away from the optical axis 653 of column 652 by a deflector in column 652 (not shown). When beam 654 strikes the surface of substrate 625 at position 655, beam 654 causes the emission of SE/BSEs 656. SE/BSEs 656 are collected by detectors 610 and 611.

Scan limits 660-663 correspond to scan limits 160-163, respectively, in FIG. 1B. The formula for calculating the number of columns is the same as for the first embodiment. The fifth embodiment of the present invention differs from the previous embodiments in the number of detectors per column (4 instead of 2 or 3), making the number of detectors four times the number of columns. The method for correction of intercolumn crosstalk is the same as for the other embodiments: dynamic selection of which detectors to use with each column depending on the positions of the beams on the substrate. The same definitions for the width of the beam scan, S, and the SE/BSE range parameter, L, are used as for FIGS. 2-5. Table XVII shows the column scan parameters for FIG. 6.

TABLE XVII

FIG. 6 column parameters in units of the scan width, S.
FIG. 6 Column Scan Parameters

| Column Number | 640 | 646 | 652 |
|---|---|---|---|
| Optical Axis | 641 | 647 | 653 |
| Optical Axis Location | S/2 | 3 S/2 | 5 S/2 |
| Left Scan Limit | 660 | 661 | 662 |
| Left Scan Limit Location | 0 | S | 2 S |
| Right Scan Limit | 661 | 662 | 663 |
| Right Scan Limit Location | S | 2 S | 3 S |

Table XVIII shows parameters for column 640, including the definitions of eight regions M1-M8, which together constitute the full width, S, of the scan range for beam 642 for the case where L/S is between 0 and 0.125. Assume that the columns have priorities starting with column 640 (1$^{st}$ priority), column 646 (2$^{nd}$ priority), column 652 (3$^{rd}$ priority), etc. where "priority" has the same definition as for FIGS. 2-5. The same beam scanning restrictions would apply to columns 640, 646, and 652 as outlined above for columns 240, 246 and 252. The detector selection process shown in Tables XVIII-XX would be implemented in either the analog signal combiner 1035 in FIG. 10 or in the digital signal combiner 1155 in FIG. 11.

TABLE XVIII

Collection of SE/BSEs 644 depending on the position 643 of beam 642 on the substrate surface 625 for L/S between 0 and 0.125.
Column 640 SE/BSE Collection for 0 < L/S < 0.125

| Region | Position 643 Range Left | Right | Detectors Collecting SE/BSEs 644 |  |  |  |  |
|---|---|---|---|---|---|---|---|
|  |  |  | 600 | 601 | 602 | 603 | 604 |
| M1 | 0 | S/4 − L | X |  |  |  |  |
| M2 | S/4 − L | S/4 + L | X | X |  |  |  |
| M3 | S/4 + L | S/2 − L |  | X |  |  |  |
| M4 | S/2 − L | S/2 + L |  | X | X |  |  |
| M5 | S/2 + L | 3 S/4 − L |  |  | X |  |  |
| M6 | 3 S/4 − L | 3 S/4 + L |  |  | X | X |  |
| M7 | 3 S/4 + L | S − L |  |  |  | X |  |
| M8 | S − L | S |  |  |  | X | X |

TABLE XIX

Collection of SE/BSEs 650 depending on the position 649 of beam 648 on the substrate surface 625 for L/S between 0 and 0.125.
Column 646 SE/BSE Collection for 0 < L/S < 0.125

| Region | Position 649 Range Left | Right | Detectors Collecting SE/BSEs 650 |  |  |  |  |  |
|---|---|---|---|---|---|---|---|---|
|  |  |  | 603 | 604 | 605 | 606 | 607 | 608 |
| N1 | S | S + L | X | X |  |  |  |  |
| N2 | S + L | 5 S/4 − L |  | X |  |  |  |  |
| N3 | 5 S/4 − L | 5 S/4 + L |  | X | X |  |  |  |
| N4 | 5 S/4 + L | 3 S/2 − L |  |  | X |  |  |  |
| N5 | 3 S/2 − L | 3 S/2 + L |  |  | X | X |  |  |
| N6 | 3 S/2 + L | 7 S/4 − L |  |  |  | X |  |  |
| N7 | 7 S/4 − L | 7 S/4 + L |  |  |  | X | X |  |
| N8 | 7 S/4 + L | 2 S − L |  |  |  |  | X |  |
| N9 | 2 S − L | 2 S |  |  |  |  | X | X |

TABLE XX

Collection of SE/BSEs 656 depending on the position 655 of beam 654 on the substrate surface 625 for L/S between 0 and 0.125.
Column 652 SE/BSE Collection for 0 < L/S < 0.125

| Region | Position 655 Range Left | Right | Detectors Collecting SE/BSEs 656 |  |  |  |  |  |
|---|---|---|---|---|---|---|---|---|
|  |  |  | 607 | 608 | 609 | 610 | 611 | 612 |
| O1 | 2 S | 2 S + L | X | X |  |  |  |  |
| O2 | 2 S + L | 9 S/4 − L |  | X |  |  |  |  |
| O3 | 9 S/4 − L | 9 S/4 + L |  | X | X |  |  |  |
| O4 | 9 S/4 + L | 5 S/2 − L |  |  | X |  |  |  |
| O5 | 5 S/2 − L | 5 S/2 + L |  |  | X | X |  |  |
| O6 | 5 S/2 + L | 11 S/4 − L |  |  |  | X |  |  |
| O7 | 11 S/4 − L | 11 S/4 + L |  |  |  | X | X |  |
| O8 | 11 S/4 + L | 3 S − L |  |  |  |  | X |  |
| O9 | 3 S − L | 3 S |  |  |  |  | X | X |

Similar to the case for FIG. 2, different tables (not shown) describe the collection of SEs/BSEs for L/S in the range from 0.125 to 0.50. These tables show that the embodiment in FIG. 6 can be used for L/S<0.50. For L/S>0.50, there is always an unresolvable conflict between neighboring columns.

Figure 7:
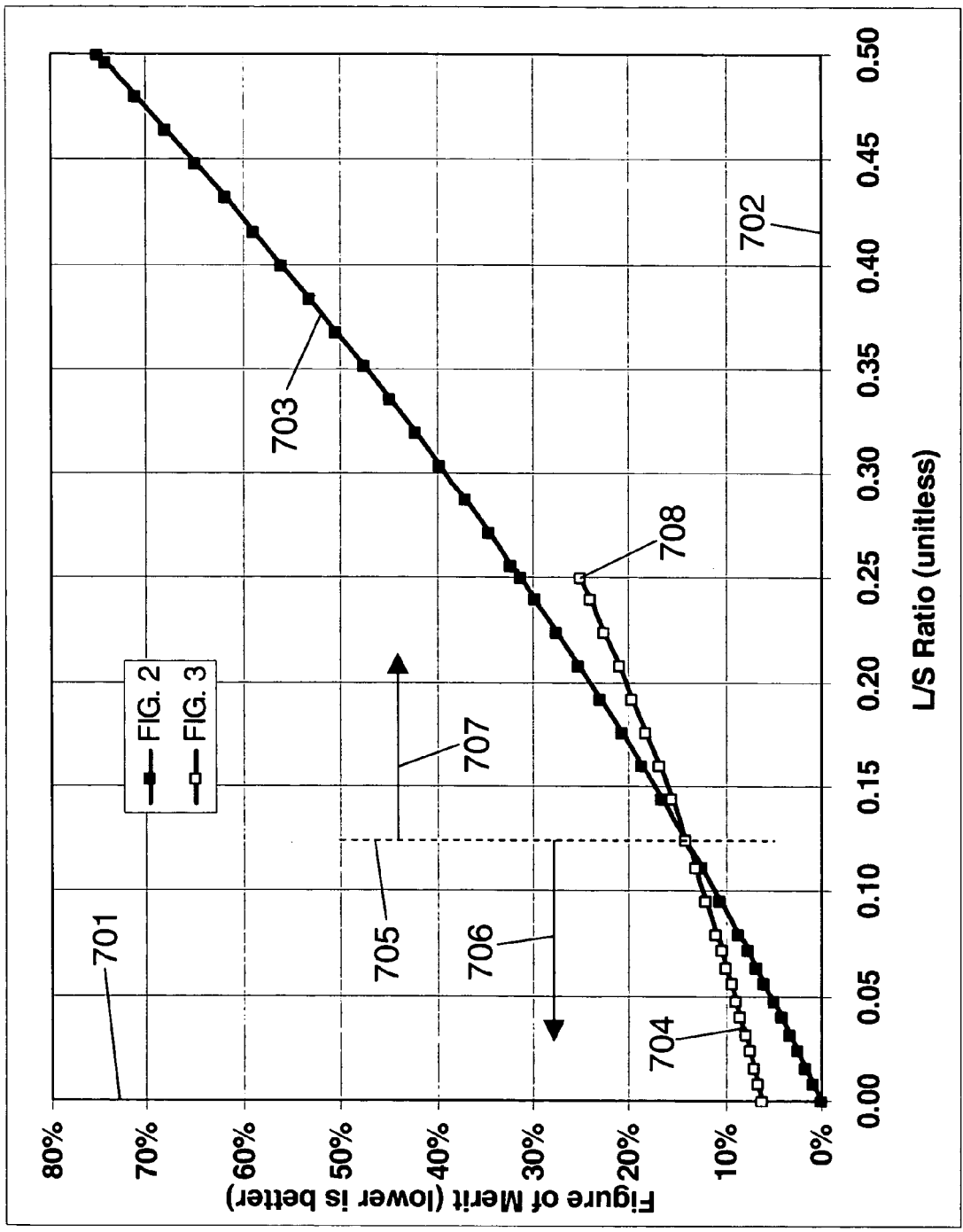
FIG. 7 is a graph of the figure of merit against the L/S ratio for the first and second embodiments of the present invention.

FIG. 7 is a graph showing the relative performance of the first and second embodiments shown in FIGS. 2-3, as characterized by a parameter "figure of merit" (defined below) plotted on the vertical axis 701 against the L/S ratio on the horizontal axis 702. The performance of either embodiment is a function only of the ratio of the two parameters, L and S, not their absolute values. Thus S=125 mm and L=4 mm (L/S=0.032) will have the same performance as S=250 mm and L=8 mm. To simplify the calculations, assume that the application is testing of flat panel display substrates and that the pixels to be tested are evenly distributed across the substrate surface (this ignores the effects of areas on the substrate containing connection pads, shorting bars, alignment marks, or empty space). Using the first embodiment with values of S=125 mm and L=4 mm, Table XXI shows the percentages of time that position 243 spends in each of regions A1-A4. Table XXI shows that if L<<S, position 243 will spend most of the time in regions A1 and A3.

TABLE XXI

For column 240 in FIG. 2, the percentages of time that position 243 would be within each region in Table IIA for L/S = 0.032.

| Region | % of time in Region |
|---|---|
| A1 | 46.8% |
| A2 | 6.4% |
| A3 | 43.6% |
| A4 | 3.2% |
| TOTAL | 100.0% |

TABLE XXII

For column 246 in FIG. 2, the percentages of time that position 249 would be within each region in Table IIIA for L/S = 0.032.

| Region | % of time in Region | % of time not allowed | Product of % s |
|---|---|---|---|
| B1 | 3.2% | 53.2% | 1.70% |
| B2 | 43.6% | 3.2% | 1.40% |
| B3 | 6.4% | 3.2% | 0.20% |
| B4 | 43.6% | 0.0% | 0.00% |
| B5 | 3.2% | 0.0% | 0.00% |
| TOTAL | 100.0% | | 3.30% |

Table XXII for column 246 is similar to Table XXI for column 240, except now we must take into account the interaction between the higher priority column 240 and the next lower priority column 246—there are times when position 249 cannot be placed where it normally would be due to conflicts with column 240. The second column from the left in Table XXII is similar to the right column in Table XXI—since L<<S, position 249 is usually in regions B2 and B4. The third column from the left shows the "% of time not allowed"—this is the fraction of time that position 243 falls within a region which prevents position 249 from being placed in the region (left column) corresponding to each row. In quantifying the level of intercolumn conflicts, the relevant factor is the product of these two percentages, as shown in the rightmost column. For example, position 249 would normally be in region B1 3.2% of the time, but 52.3% of the time, position 243 is in conflict—if we take a worst case assumption that beam 248 remains blanked until position 243 moves out of regions A2-A4, then the product gives a contribution of 1.70%. Similarly, position 249 would normally be in region B2 43.6% of the time, but 3.2% of the time, position 243 would be in conflict, giving a product of 1.40%. Summing the percentages for all regions B1-B5 gives 3.30% which serves as a figure of merit for the first embodiment in FIG. 2 for the case of L/S=0.032. A similar calculation for the second embodiment in FIG. 3 with the same L/S ratio gives a figure of merit of 7.95%. The lower the figure of merit the better, so for L/S=0.032, the first embodiment is preferred. Table XXIII shows figures of merit for both the first and second embodiments for L/S from 0.0 to 0.50. Curve 703 shows the figure of merit for the first embodiment (FIG. 2) and curve 704 is for the second embodiment (FIG. 3). For L/S<0.125, the first embodiment is preferred (arrow 706). For 0.125<L/S<0.25, the second embodiment is preferred (arrow 707). The separation between these two regimes is shown as dashed line 705. Above L/S=0.25, however, the embodiment in FIG. 3 is not applicable, due to the unresolvable intercolumn conflicts discussed above, thus curve 704 ends at point 708 (see FIG. 7). In Table XXIII, the preferred embodiments are shown in bold.

Using the formulas in Tables IIA-IVB and it is possible to derive the analytical formula for curve 703:

Figure of Merit=$(L/S)+(L/S)^2$ for $0 \leq L/S \leq 0.50$

Similarly, Tables VI-VIIIB show that for curve 704 the formula is:

Figure of Merit=$(1/16)+0.5(L/S)+(L/S)^2$ for $0 \leq L/S \leq 0.25$

Figure 8:
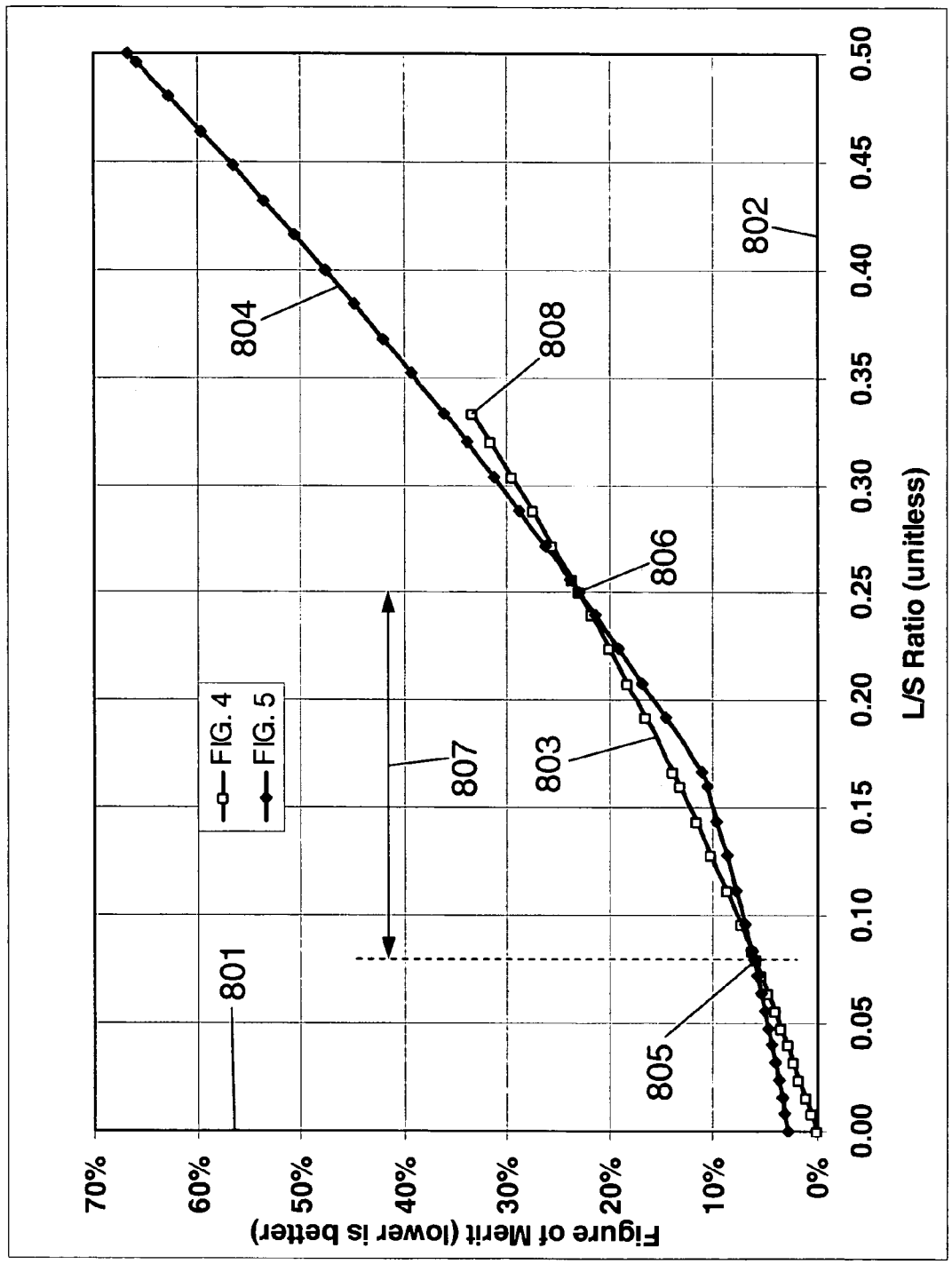
FIG. 8 is a graph of the figure of merit against the L/S ratio for the third and fourth embodiments of the present invention.

FIG. 8 is a graph showing the relative performance of the third and fourth embodiments shown in FIGS. 4-5, as characterized by the same "figure of merit" used in FIG. 7. The figure of merit is plotted on the vertical axis 801 against the L/S ratio on the horizontal axis 802. The performance of either embodiment is a function only of the L/S ratio. Similar calculations to those summarized in Tables XXI and XXII can be generated for the third and fourth embodiments—the figure of merit results are shown as curves 803 (for FIG. 4) and 804 (for FIG. 5). For L/S<1/12 (location 805), the third embodiment is preferred over the fourth embodiment. For 1/12<L/S<0.25, the fourth embodiment is preferred (range 807). For 0.25<L/S<1/3, the third embodiment is again preferred over the fourth embodiment. Above L/S=1/3, however, the third embodiment in FIG. 4 cannot be used, due to the unresolvable intercolumn conflicts discussed above, thus curve 803 ends at point 808 (see FIG. 8). FIG. 8 shows that curves 803 and 804 give very similar values for the figure of merit—if there is any chance that L/S will ever exceed 1/3, then only the fourth embodiment (FIG. 5) should be used.

The analytical formula for curve 803 is:

Figure of Merit=$(2/3)(L/S)+(L/S)^2$ for $0 \leq L/S \leq 1/3$

The analytical formula for curve 804 has two parts:

Figure of Merit=$(1/36)+(1/3)(L/S)+(L/S)^2$ for $0 \leq L/S \leq 1/6$

Figure of Merit=$(-1/12)+(L/S)+(L/S)^2$ for $1/6 \leq L/S \leq 0.5$

Comparison of curves 803 and 804 with curves 703 and 704 in FIG. 7 shows that increasing the number of detectors per column from 2 to 3 leads to a slight improvement in the figure of merit values. Table XXIV compares the figures of merit for all five embodiments with L/S=0.032—it is clear that larger numbers of detectors reduce the figure of merit, but at the cost of more detectors and preamps, a more complex signal combiner, and (for FIG. 11) more ADCs.

TABLE XXIII

Comparison of the figures of merit for the first and second embodiments (FIGS. 2 and 3, respectively).

| | | Figures of Merit (lower is better) | |
|---|---|---|---|
| L | L/S | FIG. 2 | FIG. 3 |
| 0 | 0.000 | 0.00% | 6.25% |
| 1 | 0.008 | 0.81% | 6.66% |
| 2 | 0.016 | 1.63% | 7.08% |
| 3 | 0.024 | 2.46% | 7.51% |
| 4 | 0.032 | 3.30% | 7.95% |
| 5 | 0.040 | 4.16% | 8.41% |
| 6 | 0.048 | 5.03% | 8.88% |
| 7 | 0.056 | 5.91% | 9.36% |
| 8 | 0.064 | 6.81% | 9.86% |
| 9 | 0.072 | 7.72% | 10.37% |
| 10 | 0.080 | 8.64% | 10.89% |
| 12 | 0.096 | 10.52% | 11.97% |
| 14 | 0.112 | 12.45% | 13.10% |
| 15.625 | 0.125 | 14.06% | 14.06% |
| 18 | 0.144 | 16.47% | 15.52% |
| 20 | 0.160 | 18.56% | 16.81% |
| 22 | 0.176 | 20.70% | 18.15% |
| 24 | 0.192 | 22.89% | 19.54% |
| 26 | 0.208 | 25.13% | 20.98% |
| 28 | 0.224 | 27.42% | 22.47% |
| 30 | 0.240 | 29.76% | 24.01% |
| 31.25 | 0.250 | 31.25% | 25.00% |
| 32 | 0.256 | 32.15% | N/A |
| 34 | 0.272 | 34.60% | N/A |
| 36 | 0.288 | 37.09% | N/A |
| 38 | 0.304 | 39.64% | N/A |
| 40 | 0.320 | 42.24% | N/A |
| 42 | 0.336 | 44.89% | N/A |
| 44 | 0.352 | 47.59% | N/A |
| 46 | 0.368 | 50.34% | N/A |
| 48 | 0.384 | 53.15% | N/A |
| 50 | 0.400 | 56.00% | N/A |
| 52 | 0.416 | 58.91% | N/A |
| 54 | 0.432 | 61.86% | N/A |
| 56 | 0.448 | 64.87% | N/A |
| 58 | 0.464 | 67.93% | N/A |
| 60 | 0.480 | 71.04% | N/A |
| 62 | 0.496 | 74.20% | N/A |
| 62.5 | 0.500 | 75.00% | N/A |

Figure 9:
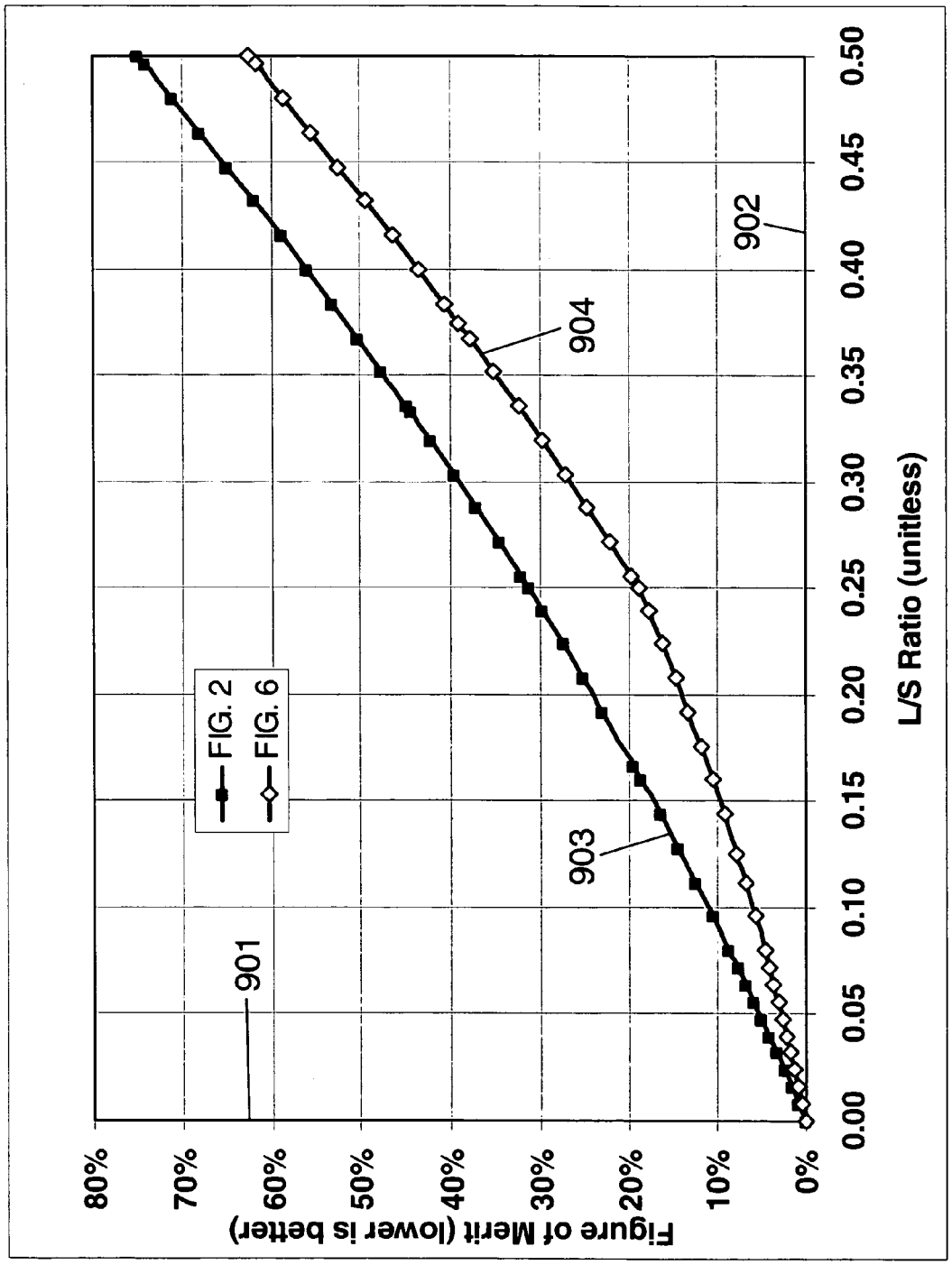
FIG. 9 is a graph of the figure of merit against the L/S ratio for the first and fifth embodiments of the present invention.

FIG. 9 is a graph showing the relative performance of the first and fifth embodiments shown in FIGS. 2 and 6, as characterized by the same "figure of merit" used in FIG. 7. The figure of merit is plotted on the vertical axis 901 against the US ratio on the horizontal axis 902. The performance of either embodiment is a function only of the L/S ratio. Similar calculations to those in Tables XXI and XXII can be generated for the fifth embodiment—the figure of merit results are shown as curves 903 (for FIG. 2) and 904 (for FIG. 6). For all US values from 0.0 to 0.50, FIG. 6 is preferred, but again at the cost of more detectors and preamps, a more complex signal combiner, and (for FIG. 11) more ADCs.

The analytical formula for curve 904 has two parts:

Figure of Merit=$0.5\,(L/S)+(L/S)^2$ for $0 \leq L/S \leq 0.25$

Figure of Merit=$(-1/8)+(L/S)+(L/S)^2$ for $0.25 \leq L/S \leq 0.5$

TABLE XXIV

Relative Figures of Merit for all five embodiments with L/S = 0.032. Figures of Merit (lower is better)

| FIG. 2 | 3.30% |
|---|---|
| FIG. 3 | 7.95% |

TABLE XXIV-continued

Relative Figures of Merit for all five embodiments with L/S = 0.032. Figures of Merit (lower is better)

| FIG. 4 | 2.24% |
|---|---|
| FIG. 5 | 3.95% |
| FIG. 6 | 1.70% |

Table XXV is a comparison of the figures of merit for the cases where the detector length, D, meets the following two requirements: D=L, and D=2 L. As expected, the figure of merit is improved (has lower values) for increasing numbers of detectors per column. Also, the larger the detector length, D, is relative to the SE/BSE distribution, the lower the figure of merit.

TABLE XXV

Relative figures of merit (FoM) taking the detector length D = L and D = 2 L.

| | # detectors | D relative to | D = L | | D = 2 L | |
|---|---|---|---|---|---|---|
| FIG. | per column | scan width S | L/S | FoM | L/S | FoM |
| 2 | 2 | D = S/2 | 0.5 | 75.00% | 0.25 | 31.25% |
| 3 | 2 | D = S/2 | 0.5 | 68.75% | 0.25 | 25.00% |
| 4 | 3 | D = S/3 | 1/3 | 33.33% | 1/6 | 13.89% |
| 5 | 3 | D = S/3 | 1/3 | 36.11% | 1/6 | 11.11% |
| 6 | 4 | D = S/4 | 0.25 | 18.75% | 0.125 | 7.81% |

FIG. 10 is a schematic block diagram of a detector optics circuit for use with any of the detector optics configurations described in FIGS. 2-6. Shown in FIG. 10 are detector array 1000 (comprising detectors 1001-1010), detector outputs 1011-1020, preamplifiers 1021-1030, preamplifier outputs 1031-1040, analog signal combiner (ASC) 1035, ASC outputs 1041-1044, analog-to-digital converters (ADCs) 1045-1048, ADC outputs 1049-1052, and control signal input 1036. The number of detectors in detector array 1000 depends on details of the specific application. In particular, for flat panel display substrate testing, the total number of detectors is determined by the width of the substrate and the scan width of each column, as well as the detector array design (the number of detectors per column). The descriptions of FIGS. 2-6, above, provide detailed methods for determining the required numbers of detectors for all five embodiments of the present invention described herein. Each of the detectors 1001-1010 generates a signal roughly proportional to the number of SE/BSEs incident on the electron collection surface of each detector 1001-1010. Detector outputs 1011-1020 are typically wires or coaxial cables which convey a current or voltage signal from each of the detectors 1001-1010 to one of the preamplifiers 1021-1030. As is familiar to those skilled in the art, preamplifiers typically perform one or more of the following functions:

(1) Current-to-voltage conversion—a transimpedance amplifier converts an incoming current signal from the detector into a voltage signal suitable for further processing in steps (2) and (3). For detectors which inherently generate a voltage signal, this function is not needed.

(2) Signal Conditioning—in this function, the bandwidth of the signal is limited. Bandwidth limitations include high pass filtering ("ac coupling" which eliminates dc voltages and low frequencies), or low-pass filtering which reduces signal noise at frequencies above those of interest for the particular application.

(3) Voltage Gain—this function is the final magnification of the signal to voltage levels suitable for further processing, such as analog combination or analog-to-digital conversion.

The preamplifier outputs 1031-1040 are the inputs to the analog signal combiner (ASC) 1035. The function of the ASC 1035 is to combine preamplifier outputs 1031-1040 to generate ASC outputs 1041-1044. The total number of ASC outputs 1041-1044 is equal to the number of electron beam columns. The procedure for combining preamplifier outputs 1031-1040 in the ASC 1035 is given in the descriptions for FIGS. 2-6, with the correspondences of callouts between FIGS. 2-6 and FIG. 10 shown in Table XXVI.

TABLE XXVI

Correspondence between detector callouts in FIGS. 2–6, 10–11.

| Callout in FIG. 2 | Callout in FIG. 3 | Callout in FIG. 4 | Callout in FIG. 5 | Callout in FIG. 6 | Callout in FIG. 10 | Callout in FIG. 11 |
|---|---|---|---|---|---|---|
| 200 | 300 | 400 | 500 | 600 | 1001 | 1101 |
| 201 | 301 | 401 | 501 | 601 | 1002 | 1102 |
| 202 | 302 | 402 | 502 | 602 | 1003 | 1103 |
| 203 | 303 | 403 | 503 | 603 | 1004 | 1104 |

The ADC outputs 1049-1052 can be either serial or parallel digital signals, suitable for further processing by a data acquisition computer (not shown). The control signal input 1036 comes from the system control computer (not shown) and conveys information to the ASC 1035 about the positions of the beams on the substrate surface—this tells the ASC 1035 which detectors are collecting the various SE/BSE signals caused by each beam as described in FIGS. 2-6.

FIG. 11 is a schematic block diagram of an alternative detector optics circuit for use with any of the detector optics configurations described in FIGS. 2-6. Shown in FIG. 11 are detector array 1100 (comprising detectors 1101-1110), detector outputs 1111-1120, preamplifiers 1121-1130, preamplifier outputs 1131-1140, digital-to-analog converters (ADCs) 1141-1150, ADC outputs 1151-1160, digital signal combiner (DSC) 1155, DSC outputs 1161-1164, and control signal input 1156. The same considerations apply to FIG. 11 as applied to FIG. 10 with respect to the number of detectors in array 1100, the functionality of the preamplifiers, and the correspondence between detector callouts (see Table XXVI). Each of the detectors 1101-1110 generates a signal roughly proportional to the number of SE/BSEs incident on the collection surface of each detector 1101-1110. Detector outputs 1111-1120 are typically wires or coaxial cables which convey a current or voltage signal from each of the detectors 1101-1110 to one of the preamplifiers 1121-1130. Preamplifier outputs 1131-1140 are the inputs to the analog-to-digital converters (ADCs) 1141-1150. ADC outputs 1151-1160 can be either serial or parallel digital signals and are the inputs to the digital signal combiner (DSC) 1155. The function of the DSC 1155 is to combine ADC outputs 1151-1160 to generate DSC outputs 1161-1164. The total number of DSC outputs 1161-1164 is equal to the number of electron beam columns. The procedure for combining ADC outputs 1151-1160 in the DSC 1155 is given in the descriptions for FIGS. 2-6, with the correspondences of callouts between FIGS. 2-6 and FIG. 11 given in Table XXVI. The DSC outputs 1161-1164 can be either serial or parallel digital signals, suitable for further processing by a data acquisition computer (not shown). The control signal input 1156 comes from the system control computer (not shown) and conveys information to the DSC 1155 about the positions of the beams on the substrate surface—this tells the DSC 1155 which detectors are collecting the various SE/BSE signals caused by each beam as described in FIGS. 2-6.

Optimization Principles for the Design of the Detector Arrays

Optimization of the detector design array involves the balancing of a number of factors, including the number of detectors (relative to the number of columns), the width of the separators, the maximum expected value for L/S, and the choice of signal combination circuit (either analog or digital). Table XXVII summarizes how variations in each of these parameters affect the overall system performance, cost and reliability.

TABLE XXVII

Optimization of system design parameters. FIGS. 10 and 11 are compared with each other in the table. The use of feedback is compared to the situation with no feedback.

| Design Parameter | Advantage | Disadvantage |
|---|---|---|
| Increase Number of Detectors | 1) Improved figure of merit<br>2) Higher throughput from fewer intercolumn conflicts | 1) Higher cost<br>2) Higher part count<br>3) Lower reliability |
| Increase Width of Separators | 1) Improved electrical isolation between detectors<br>2) Improved bandwidth through lower capacitance | 1) Decreased collection of SE/BSEs due to losses on separator surface<br>2) Possible charging of separator by SE/BSEs |
| Increase L/S | 1) SE/BSE signal spread over more detectors (possible detector lifetime increase)<br>2) Can enable larger optics-to-substrate gap | 1) Figure of merit worse<br>2) Decreased throughput |
| Decrease L/S | 1) Figure of merit better<br>2) Improved throughput | 1) SE/BSE signal on fewer detectors (possible detector lifetime decrease)<br>2) May require smaller optics-substrate gap |

TABLE XXVII-continued

Optimization of system design parameters. FIGS. 10 and 11 are compared with each other in the table. The use of feedback is compared to the situation with no feedback.

| Design Parameter | Advantage | Disadvantage |
| --- | --- | --- |
| FIG. 10 Detector Circuit | 1) Fewer ADCs required (one per column) 2) Lower part count 3) Potentially higher reliability | 1) Analog signal combination - less accurate |
| FIG. 11 Detector Circuit | 1) Digital signal combination - more accurate 2) May be implemented by system computer | 1) More ADCs required (one per detector) 2) Higher part count 3) Potentially lower reliability |
| Use of feedback between columns to minimize intercolumn conflicts | 1) Figure of merit better 2) Improved throughput | 1) More complex summation circuit 2) Possibly lower reliability |

ALTERNATIVE EMBODIMENTS

While the present invention has been described with reference to a single linear array of detectors, this description is solely for the purpose of illustration and is not to be construed as limiting the scope of the present invention claimed below. For example, the embodiments of the present invention contained hereinabove show a single linear array of detectors configured to collect one of the following three populations of electrons:

(1) Purely secondary electrons, with substantially no contribution from back scattered electrons,
(2) Purely backscattered electrons, with substantially no contribution from secondary electrons, or
(3) A mixture of both secondary electrons and backscattered electrons.

In some cases, it may be desirable to simultaneously collect both pure secondary electrons and pure backscattered electrons as is described in U.S. patent application Ser. No. 11/093,000 filed Mar. 28, 2005 and incorporated by reference herein.

Figure 16:
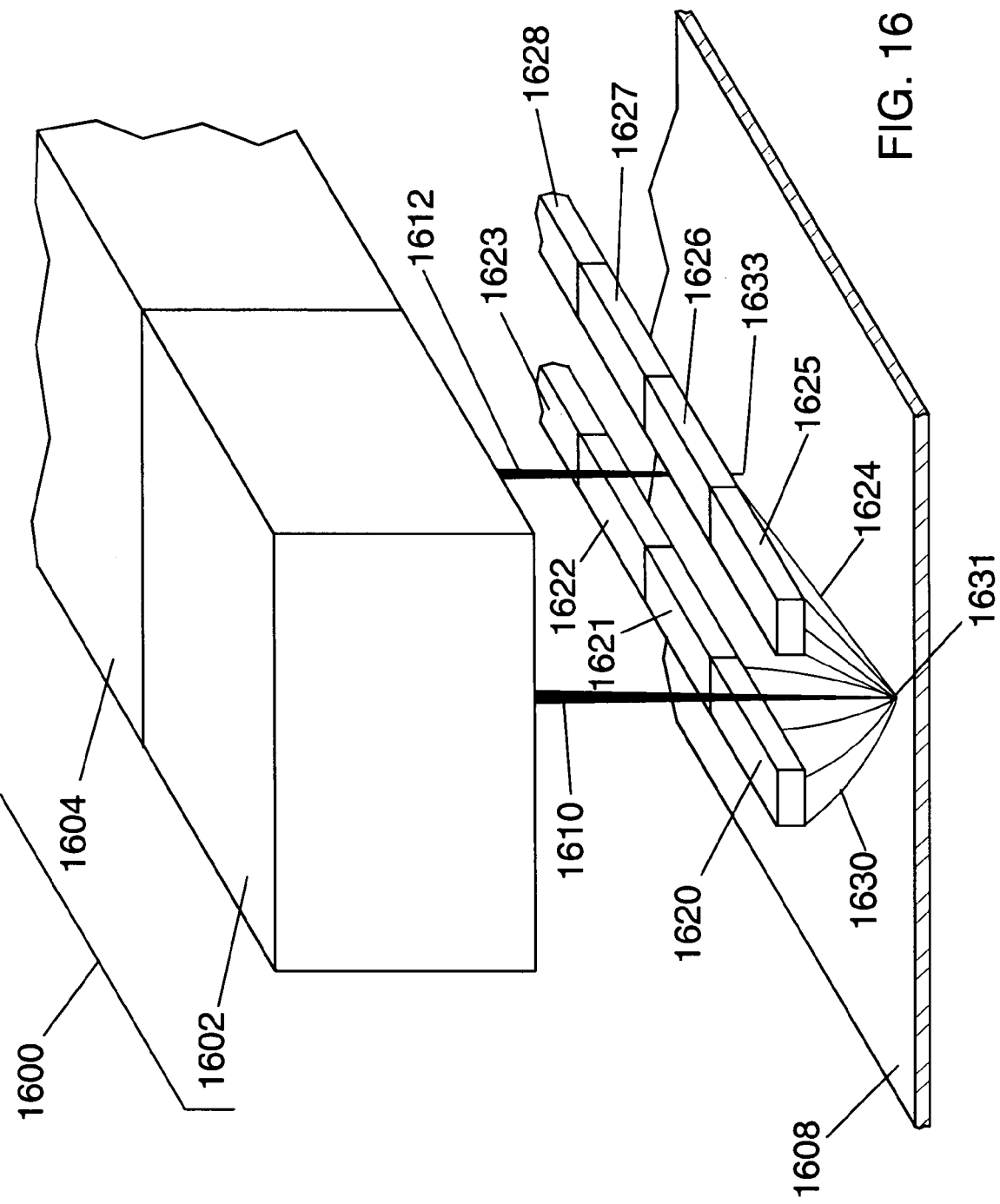
FIG. 16 is an isometric view of an electron beam test system used to generate secondary electrons and backscattered electrons (SE/BSEs) from multiple locations on a substrate surface; the SEs are collected by a first linear detector array, and the BSEs are collected by a second linear detector array on the opposite side of the linear array of beams.

The detector optics configuration illustrated in FIG. 16 shows a dual detector arrangement which provides simultaneous SE and BSE collection. FIG. 16 is an isometric view of an electron beam testing system showing multiple electron beams causing the emission of secondary electrons and backscattered electrons (SE/BSEs) simultaneously from a substrate surface—these SE/BSEs are collected by multiple detectors to generate multiple simultaneous signals (one SE signal and one BSE signal per electron beam) from a substrate. Electron-beam column array 1600 comprises columns 1602 and 1604. The linear SE detector array comprises detectors 1620-1623. The linear BSE detector array comprises detectors 1625-1628. As shown, the two linear detector arrays are positioned on opposite sides of the linear array of electron beams 1610, 1612, . . . In order to separate SEs 1630 from BSEs 1624, additional elements (not shown) may be required in the detector optics, such as illustrated in FIG. 1 of U.S. patent application Ser. No. 11/093,000 filed Mar. 28, 2005. Columns 1602 and 1604 may be identical to columns 140, 146, 152, and 158, respectively, as shown in FIGS. 1A-1B. Each of the columns in array 1600 functions independently of the other columns. For example, column 1602 generates electron beam 1610 which is focused by column 1602 onto the surface of substrate 1608 at position 1631. When beam 1610 strikes the surface of substrate 1608 at position 1631, beam 1610 causes the emission of SEs 1630 and BSEs 1624. SEs 1630 are collected by one or more of detectors 1620-1623, depending on where position 1631 is with respect to the optical axis of column 1602. The trajectories of SEs 1630 are shown curved since SEs 1630 have low energy and can be deflected by voltages within the detector optics. The trajectories of BSEs 1624 are shown as straight lines since BSEs 1624 have higher energies (near the energy of beam 1610). For clarity, the SE/BSEs caused by beam 1612 are not shown. One benefit of the dual detector arrangement of FIG. 16 is the ability to generate in real-time the ratio: (SE signal)/(BSE signal) which is independent of the current in beam 1610, as described in U.S. patent application Ser. No. 11/093,000 filed Mar. 28, 2005.

Figure 17:
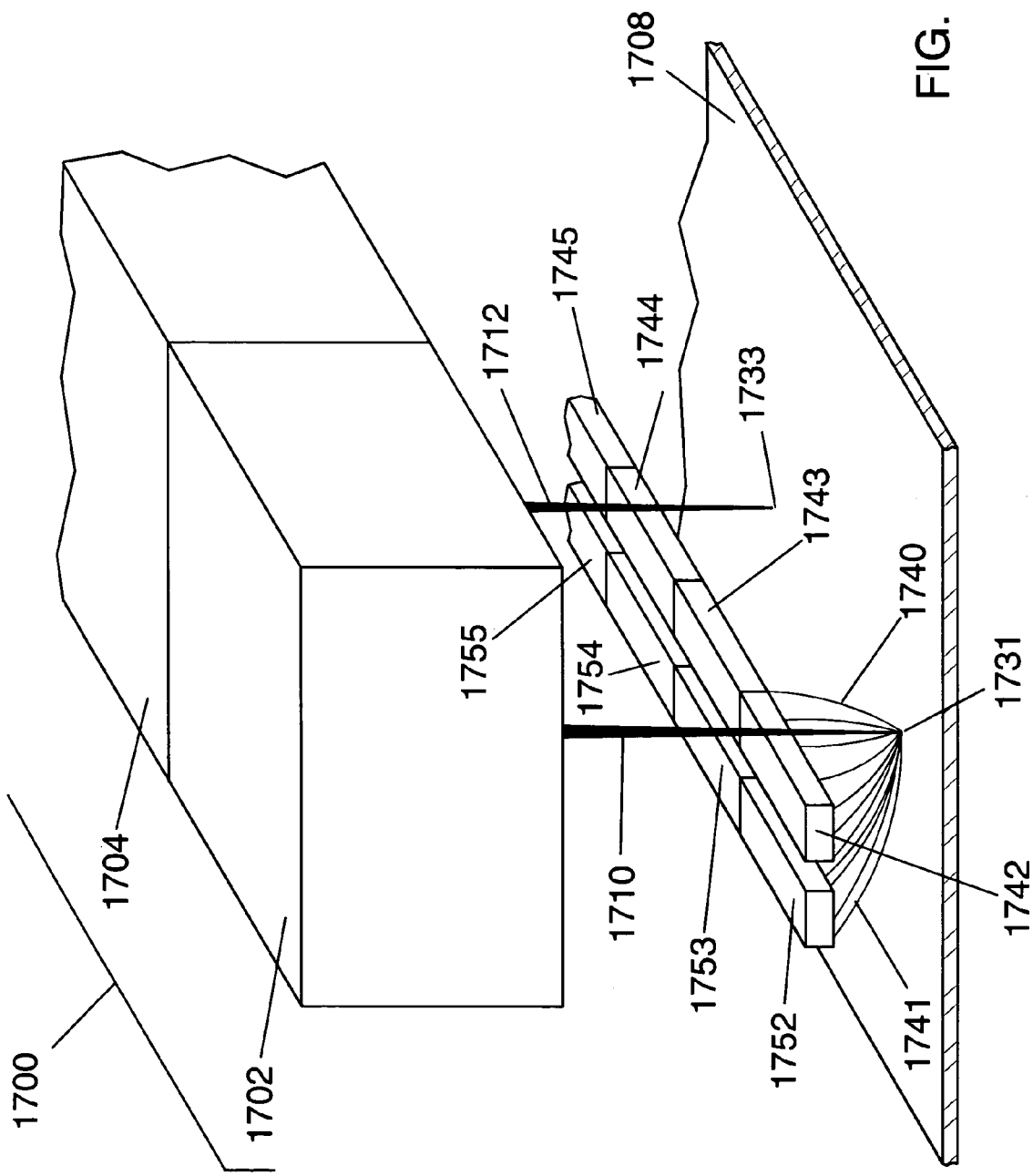
FIG. 17 is an isometric view of an electron beam test system used to generate secondary electrons and backscattered electrons (SE/BSEs) from multiple locations on a substrate surface; these SE/BSEs are collected by two linear detector arrays, both on the same side of the linear array of beams.

The detector optics configuration illustrated in FIG. 17 shows a dual detector arrangement which provides simultaneous SE/BSE collection over different solid angles subtended at the substrate surface. FIG. 17 is an isometric view of an electron beam testing system showing multiple electron beams causing the emission of secondary electrons and backscattered electrons (SE/BSEs) simultaneously from a substrate surface—these SE/BSEs are collected by multiple detectors to generate multiple simultaneous signals (in this example, two SE/BSE signals per electron beam) from a substrate. Electron-beam column array 1700 comprises columns 1702 and 1704. A first SE/BSE detector array comprises detectors 1742-1745. A second SE/BSE detector array comprises detectors 1752-1755. As shown, the two linear detector arrays are positioned on the same side of the linear array of electron beams 1710, 1712, . . . . In this example, there is no separation of SEs from BSEs, thus detectors 1742-1745, and 1752-1755 collect both SEs and BSEs. Columns 1702 and 1704 may be identical to columns 140, 146, 152, and 158, respectively, as shown in FIGS. 1A-1B. Each of the columns in array 1700 functions independently of the other columns. For example, column 1702 generates electron beam 1710 which is focused by column 1702 onto the surface of substrate 1708 at position 1731. When beam 1710 strikes the surface of substrate 1708 at position 1731, beam 1710 causes the emission of SEs and BSEs. SE/BSEs 1740 are collected by one or more of detectors 1742-1745, depending on where position 1731 is with respect to the optical axis of column 1702. SE/BSEs 1741 are collected by one or more of detectors 1752-1755, also depending on where position 1731 is with respect to the optical axis of column 1702. For clarity, the SE/BSEs caused by beam 1712 are not shown. One benefit of the dual detector arrangement of FIG. 17 is the ability to generate real-time signals (one per column) which contain topographic information about the substrate under test. As is familiar to one skilled in the art, the use of multiple detectors subtending different solid angles with respect to a target enables the collection of angle-specific SE and/or BSE signals providing information about the topography of a specimen.

Figure 18A:
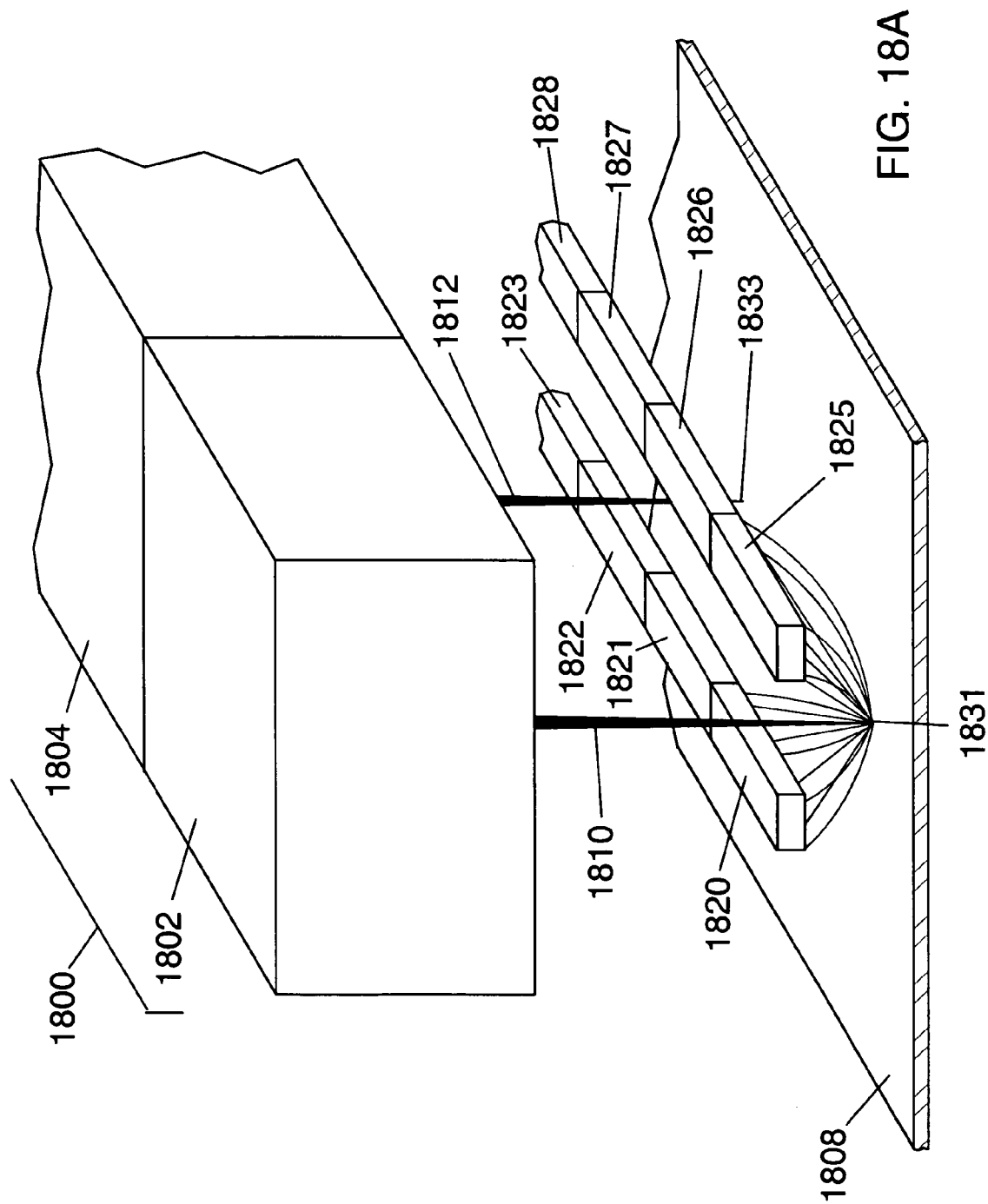
FIG. 18A is an isometric view of an electron beam test system used to generate secondary electrons and backscattered electrons (SE/BSEs) from multiple locations on a substrate surface; these SE/BSEs are collected by two linear detector arrays, one on each side of the linear array of beams.

The detector optics configuration illustrated in FIG. 18A shows a dual detector arrangement which provides simultaneous SE/BSE collection over different solid angles subtended at the substrate surface. FIG. 18A is an isometric view of an electron beam testing system showing multiple electron beams causing the emission of secondary electrons and backscattered electrons (SE/BSEs) simultaneously from a substrate surface—these SE/BSEs are collected by multiple detectors to generate multiple simultaneous signals (in this example, two SE/BSE signals per electron beam) from a substrate. Electron-beam column array 1800 comprises columns 1802 and 1804. A first SE/BSE detector array comprises detectors 1820-1823. A second SE/BSE detector array comprises detectors 1825-1828. As shown, the two linear detector arrays are positioned on opposite sides of the linear array of electron beams 1810, 1812, . . . . In this example, there is no separation of SEs from BSEs, thus detectors 1820-1823, and 1825-1828 collect both SEs and BSEs. Columns 1802 and 1804 may be identical to columns 140, 146, 152, and 158, respectively, as shown in FIGS. 1A-1B. Each of the columns in array 1800 functions independently of the other columns. For example, column 1802 generates electron beam 1810 which is focused by column 1802 onto the surface of substrate 1808 at position 1831.

Figure 18B:
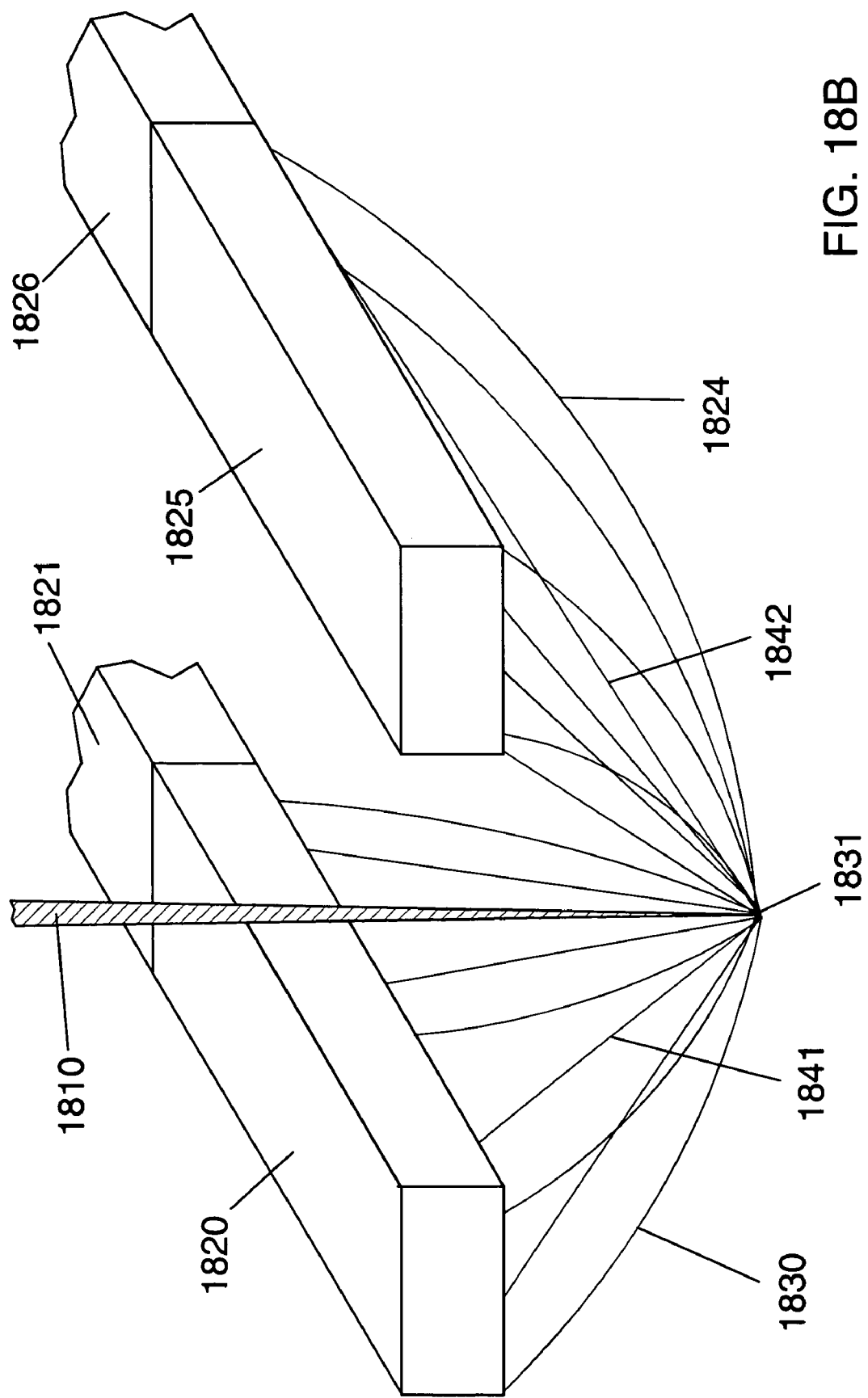
FIG. 18B is a close-up of the lower part of FIG. 18A, showing the primary beam causing the emission of SEs and BSEs.

FIG. 18B is an isometric close-up view of beam 1810 causing the emission of SEs 1830, SEs 1824, BSEs 1841 and BSEs 1842. The trajectories of SEs 1830 and 1824 are shown curved since SEs have low energy and can be deflected by voltages within the detector optics. The trajectories of BSEs 1841 and 1842 are shown as straight lines since BSEs have higher energies (near the energy of beam 1810). SEs 1830 and BSEs 1841 are collected by one or more of detectors 1820-1823, depending on where position 1831 is with respect to the optical axis of column 1802. SEs 1824 and BSEs 1842 are collected by one or more of detectors 1825-1828, also depending on where position 1831 is with respect to the optical axis of column 1802. For clarity, the SE/BSEs caused by beam 1812 are not shown. One benefit of the dual detector arrangement of FIG. 18 is the ability to generate real-time signals (one per column) which contain topographic information about the substrate under test. As is familiar to one skilled in the art, the use of multiple detectors subtending different solid angles with respect to a target enables the collection of angle-specific SE and/or BSE signals providing information about the topography of a specimen.

The present invention may also be embodied with a linear array of ion beam columns generating a linear array of ion beams, instead of electron beams. As is well known in the art, ion beams also cause the emission of secondary electrons which can be collected by a linear detector array as described in FIGS. 2-6. All of the benefits of the present invention are equally applicable for ion beams as for electron beams.

The detectors shown in FIGS. 2-6 are illustrated as having rectangular collection surfaces, however alternative embodiments may utilize linear arrays of detectors with circular or other nonrectangular shapes for their collection surfaces, arranged either in a linear array or in a roughly straight line, generally parallel to the linear array of electron or ion beams.

Although the five embodiments described herein show the separators with minimal thickness, alternative embodiments may utilize finite-width separators in order to minimize electrical (capacitive) coupling between neighboring detectors. Widening the separators will inevitably cause some loss in signal due to electrons which strike the separators rather than either of the two neighboring detector collection surfaces, this will have some deleterious effect on signal uniformity across the width, S, of the beam scan.

A more sophisticated beam scanning control could be employed which would image and/or electrically test pixels on the substrate in a different sequence in order to reduce the amount of time that beams are blanked to avoid intercolumn conflicts. This control would employ feedback which would determine the sequence of pixels on the substrate to be tested based on the availability of detectors for SE/BSE collection. For example, in Tables IIA and IIIA, whenever position 243 is in region A4, position 249 would be kept in regions B4-B5 to avoid detector utilization conflicts between columns 240 and 246—this will typically require scanning of pixels on the substrate in a nonsequential order.

What is claimed is:

1. A charged particle optical system comprising:
   a charged particle optical assembly comprising a line of N charged particle optical columns, said line of columns being aligned along a main scan axis, the optical axes of said columns being equally spaced along said line, each of said columns being configured to produce a charged particle beam, each beam being deflectable through a large angle along said main scan axis; and
   a first linear array of at least 2N electron detectors aligned parallel to and offset from said main scan axis.

2. A charged particle optical system as in claim 1 wherein said electron detectors are secondary electron detectors.

3. A charged particle optical system as in claim 1 wherein said charged particle beams are electron beams and said electron detectors are backscattered electron detectors.

4. A charged particle optical system as in claim 1, further comprising a signal combiner circuit for combining the signals from said first linear array of at least 2N electron detectors into N output signals, wherein there is one of said N output signals corresponding to each of said N charged particle beams.

5. A charged particle optical system as in claim 1, wherein said first linear array of at least 2N electron detectors consists of 2N detectors.

6. A charged particle optical system as in claim 5, wherein the spacing of said electron detectors is half the spacing of said optical axes.

7. A charged particle optical system as in claim 1, wherein said first linear array of at least 2N electron detectors consists of 2N+1 detectors.

8. A charged particle optical system as in claim 7, wherein the spacing of said electron detectors is half the spacing of said optical axes.

9. A charged particle optical system as in claim 1, wherein said first linear array of at least 2N electron detectors consists of $M_1N$ detectors with a spacing $1/M_1$ times the spacing of said optical axes, wherein $M_1$ is an integer between 2 and 10.

10. A charged particle optical system as in claim 1, wherein said first linear array of at least 2N electron detectors consists of $M_1N+1$ detectors with a spacing $1/M_1$ times the spacing of said optical axes, wherein $M_1$ is an integer between 2 and 10.

11. A charged particle optical system as in claim 1 further comprising a second linear array of at least 2N electron detectors aligned parallel to and offset from said main scan axis, said offset of said second linear array of at least 2N electron detectors being in a direction opposite to said offset of said first linear array of at least 2N electron detectors.

12. A charged particle optical system as in claim 11, wherein said first linear array of at least 2N electron detectors consists of $M_1N$ detectors with a spacing $1/M_1$ times the spacing of said optical axes, said second linear array of at least 2N electron detectors consists of $M_2N$ detectors with a spacing $1/M_2$ times the spacing of said optical axes, wherein $M_1$ and $M_2$ are integers between 2 and 10.

13. A charged particle optical system as in claim 11, wherein said first linear array of at least 2N electron detectors consists of $M_1N+1$ detectors with a spacing $1/M_1$ times the spacing of said optical axes, said second linear array of at least 2N electron detectors consists of $M_2N+1$ detectors with a spacing $1/M_2$ times the spacing of said optical axes, wherein $M_1$ and $M_2$ are integers between 2 and 10.

14. A charged particle optical system as in claim 1 further comprising $J_1$ linear arrays of at least 2N electron detectors aligned parallel to and offset from said main scan axis, said offset of said $J_1$ linear arrays of at least 2N electron detectors being in the same direction as said offset of said first linear array of at least 2N detectors, wherein $J_1$ is an integer between 1 and 4.

15. A charged particle optical system as in claim 14 further comprising $J_2$ linear arrays of at least 2N electron detectors aligned parallel to and offset from said main scan axis, said offset of said $J_1$ linear arrays of at least 2N electron detectors being in a direction opposite to said offset of said first linear array of at least 2N electron detectors, wherein $J_2$ is an integer between 1 and 5.

16. A charged particle optical system as in claim 15, wherein each of said linear arrays of at least 2N electron detectors consists of MN detectors with a spacing equal to 1/M times the spacing of said optical axes, and wherein M is an integer between 2 and 10.

17. A charged particle optical system as in claim 15, wherein each of said linear arrays of at least 2N electron detectors consists of MN+1 detectors with a spacing equal to 1/M times the spacing of said optical axes, and wherein M is an integer between 2 and 10.

18. A charged particle optical system as in claim 15, further comprising a signal combiner circuit for each of said linear arrays of at least 2N detectors, each of said signal combiner circuits being configured to combine the signals from one of said linear arrays of at least 2N electron detectors into N output signals, wherein there is one of said N output signals corresponding to each of said N electron beams.

19. A charged particle optical system as in claim 1, wherein each of said charged particle beams is deflectable in the plane of a substrate a distance greater than or equal to half the spacing of said optical axes.

20. An electron optical system comprising:
an electron optical assembly comprising a line of N electron optical columns, said line of columns being aligned along a main scan axis, the optical axes of said columns being equally spaced along said line, each of said columns being configured to produce an electron beam, each beam being deflectable through a large angle along said main scan axis;
a linear array of at least 2N secondary electron detectors aligned parallel to and offset from said main scan axis; and
a linear array of at least 2N backscattered electron detectors aligned parallel to and offset from said main scan axis, said offset of said linear array of at least 2N backscattered electron detectors being in a direction opposite to said offset of said linear array of at least 2N secondary electron detectors.

21. An electron optical system as in claim 20, wherein said linear array of at least 2N secondary electron detectors consists of $M_1N$ detectors with a spacing equal to $1/M_1$ times the spacing of said optical axes, said linear array of at least 2N backscattered electron detectors consists of $M_2N$ detectors with a spacing $1/M_2$ times the spacing of said optical axes, and wherein $M_1$ is an integer between 2 and 10 and $M_2$ is an integer between 2 and 10.

22. An electron optical system as in claim 21 wherein the ratio of the width of the secondary electron distribution at said secondary electron detectors to the spacing of said optical axes is less than $2/M_1$.

23. An electron optical system as in claim 21 wherein the ratio of the width of the backscattered electron distribution at said backscattered electron detectors to the spacing of said optical axes is less than $2/M_2$.

24. An electron optical system as in claim 20, wherein said linear array of at least 2N secondary electron detectors consists of $M_1N+1$ detectors with a spacing equal to $1/M_1$ times the spacing of said optical axes, said linear array of at least 2N backscattered electron detectors consists of $M_2N+1$ detectors with a spacing $1/M_2$ times the spacing of the optical axes of said charged particle beams, and wherein $M_1$ is an integer between 2 and 10 and $M_2$ is an integer between 2 and 10.

25. A charged particle optical system as in claim 20, further comprising:
a first signal combiner circuit for combining the signals from said linear array of at least 2N secondary electron detectors into N secondary electron output signals; and
a second signal combiner circuit for combining the signals from said linear array of at least 2N backscattered electron detectors into N backscattered electron output signals;
wherein there is one of said N secondary electron output signals corresponding to each of said N electron beams, and wherein there is one of said N backscattered electron output signals corresponding to each of said N electron beams.

* * * * *